(12) United States Patent
Iwai et al.

(10) Patent No.: US 8,009,470 B2
(45) Date of Patent: Aug. 30, 2011

(54) NONVOLATILE SEMICONDUCTOR MEMORY

(75) Inventors: Makoto Iwai, Yokohama (JP); Hiroshi Nakamura, Fujisawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 157 days.

(21) Appl. No.: 12/563,296

(22) Filed: Sep. 21, 2009

(65) Prior Publication Data
US 2010/0135078 A1 Jun. 3, 2010

(30) Foreign Application Priority Data

Dec. 3, 2008 (JP) ................................. 2008-308608

(51) Int. Cl.
*G11C 16/04* (2006.01)
(52) U.S. Cl. ......... 365/185.03; 365/185.18; 365/185.24; 365/185.22
(58) Field of Classification Search ............. 365/185.03, 365/185.18, 185.24, 185.22, 185.21, 189.05
See application file for complete search history.

(56) References Cited

U.S. PATENT DOCUMENTS

| 7,046,568 | B2 | 5/2006 | Cernea |
| 7,310,255 | B2 | 12/2007 | Chan et al. |
| 7,447,081 | B2 | 11/2008 | Chan et al. |
| 7,843,725 | B2 * | 11/2010 | Sarin et al. ............... 365/185.03 |
| 2004/0109357 | A1 | 6/2004 | Cernea et al. |

* cited by examiner

*Primary Examiner* — David Lam
(74) *Attorney, Agent, or Firm* — Oblon, Spivak, McClelland, Maier & Neustadt, L.L.P.

(57) ABSTRACT

A memory includes first and second select gate transistors, memory cells, a source line, a bit line, a selected word line which is connected to a selected memory cell as a target of a verify reading, a non-selected word line which is connected to a non-selected memory cell except the selected memory cell, a potential generating circuit for generating a selected read potential which is supplied to the selected word line, and generating a non-selected read potential larger than the selected read potential, which is supplied to the non-selected word line, and a control circuit which classifies a threshold voltage of the selected memory cell to one of three groups by verifying which area among three area which are isolated by two values does a cell current of the selected memory cell belong, when the selected read potential is a first value.

10 Claims, 19 Drawing Sheets

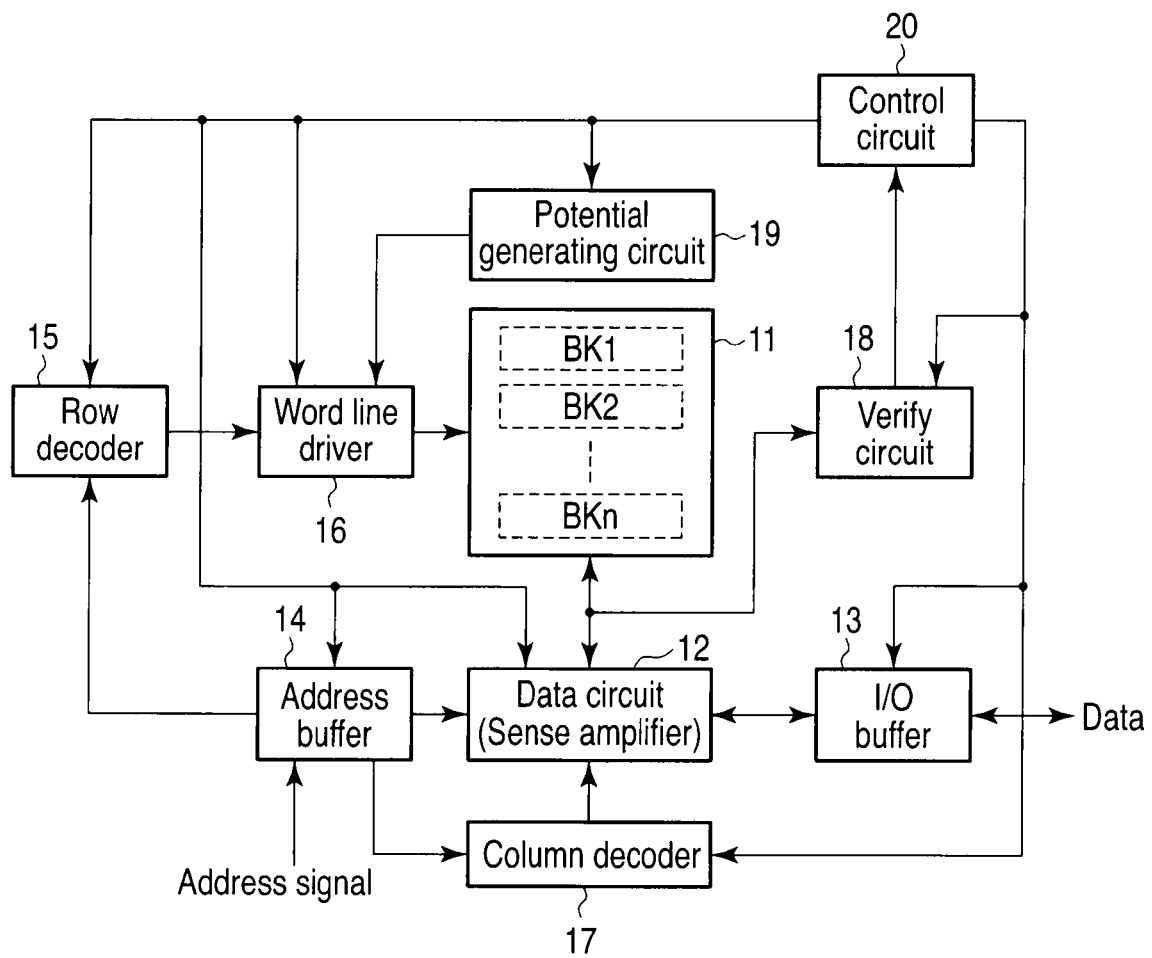
F I G. 1

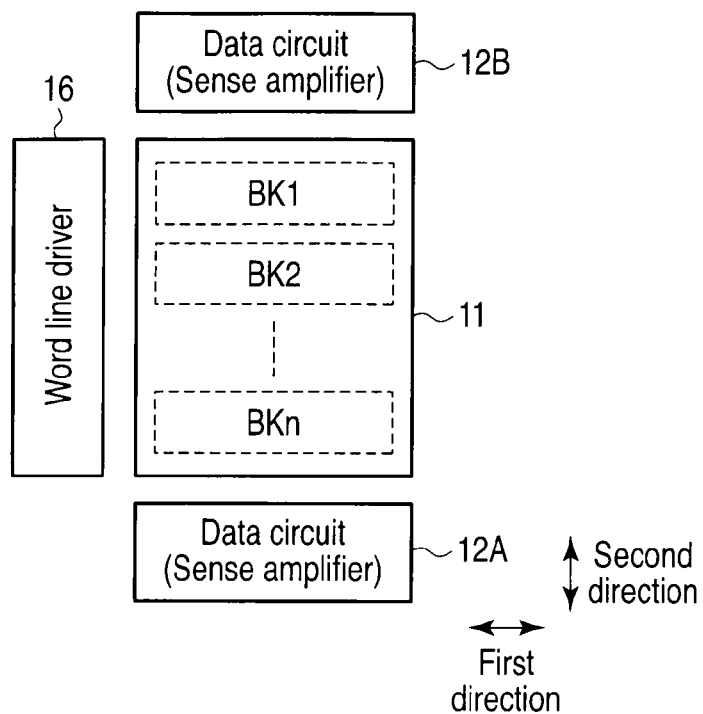
F I G. 3
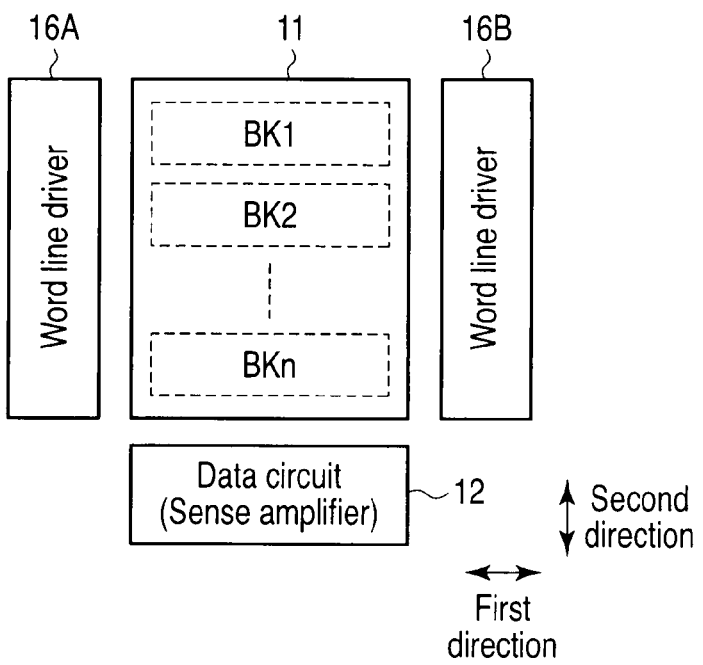
F I G. 4

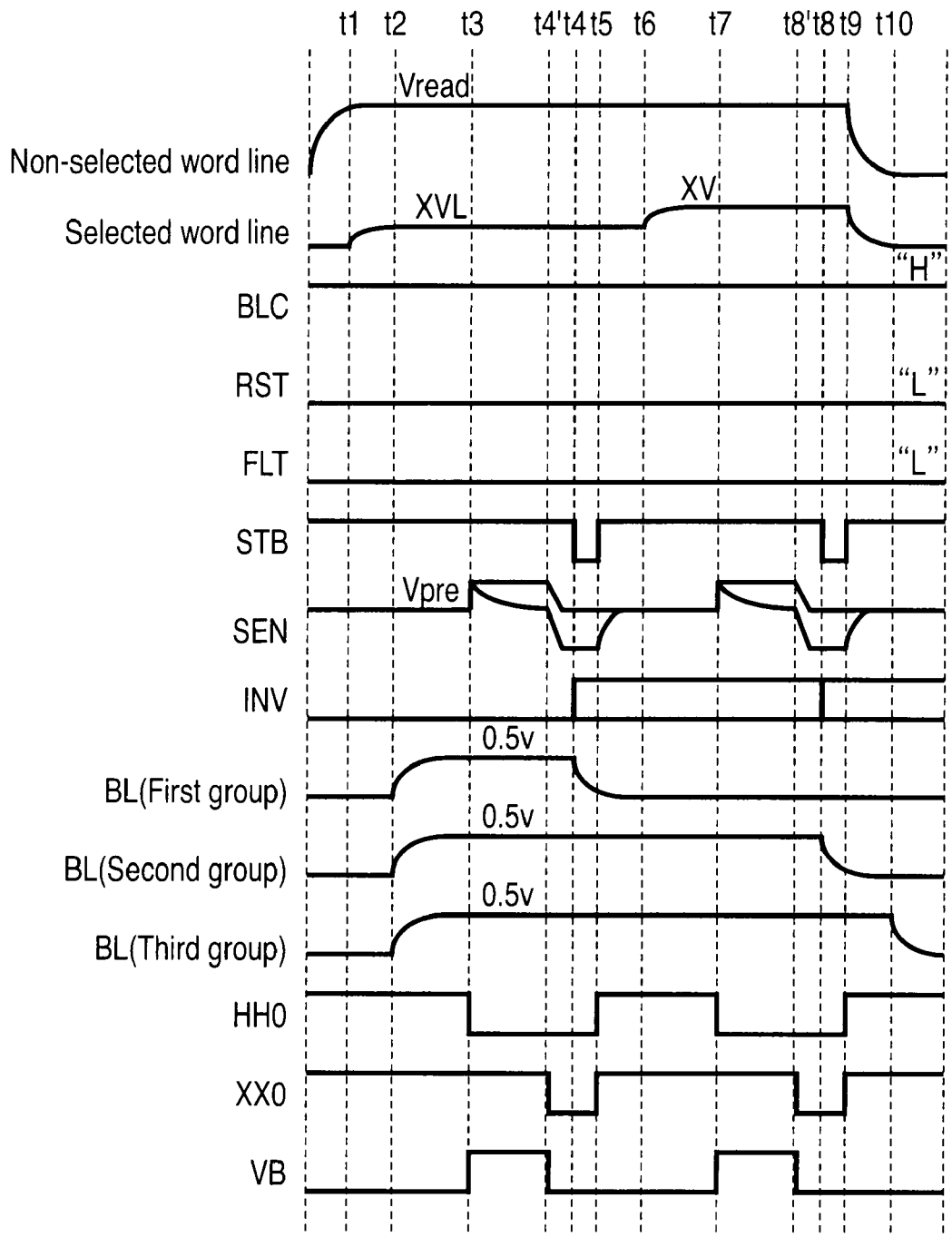
F I G. 11

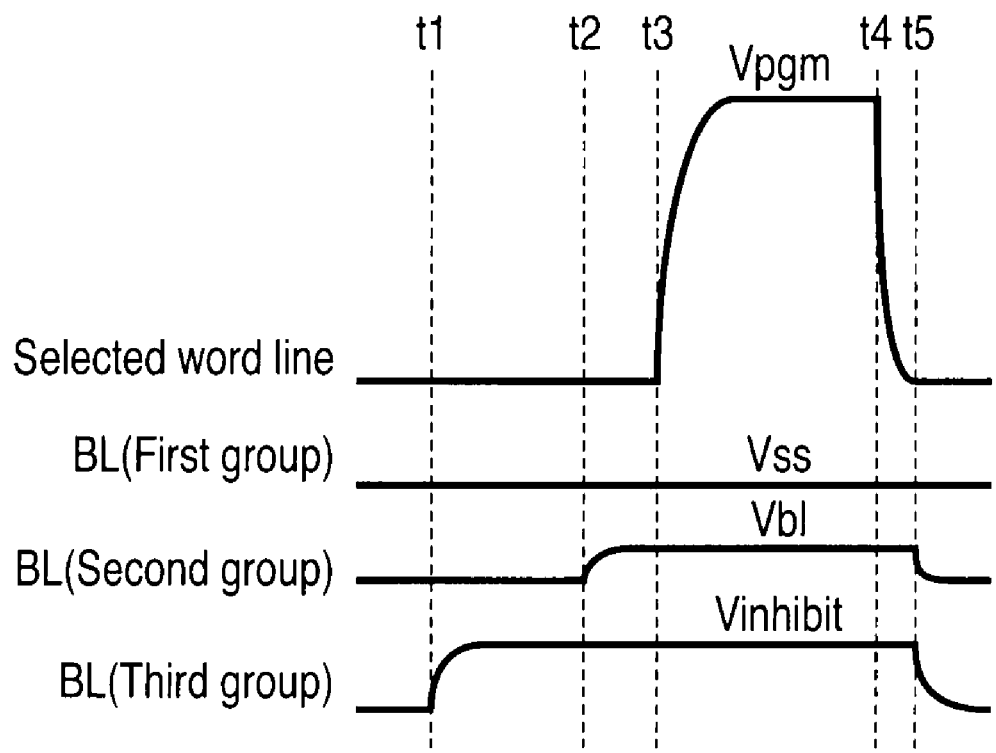
F I G. 12

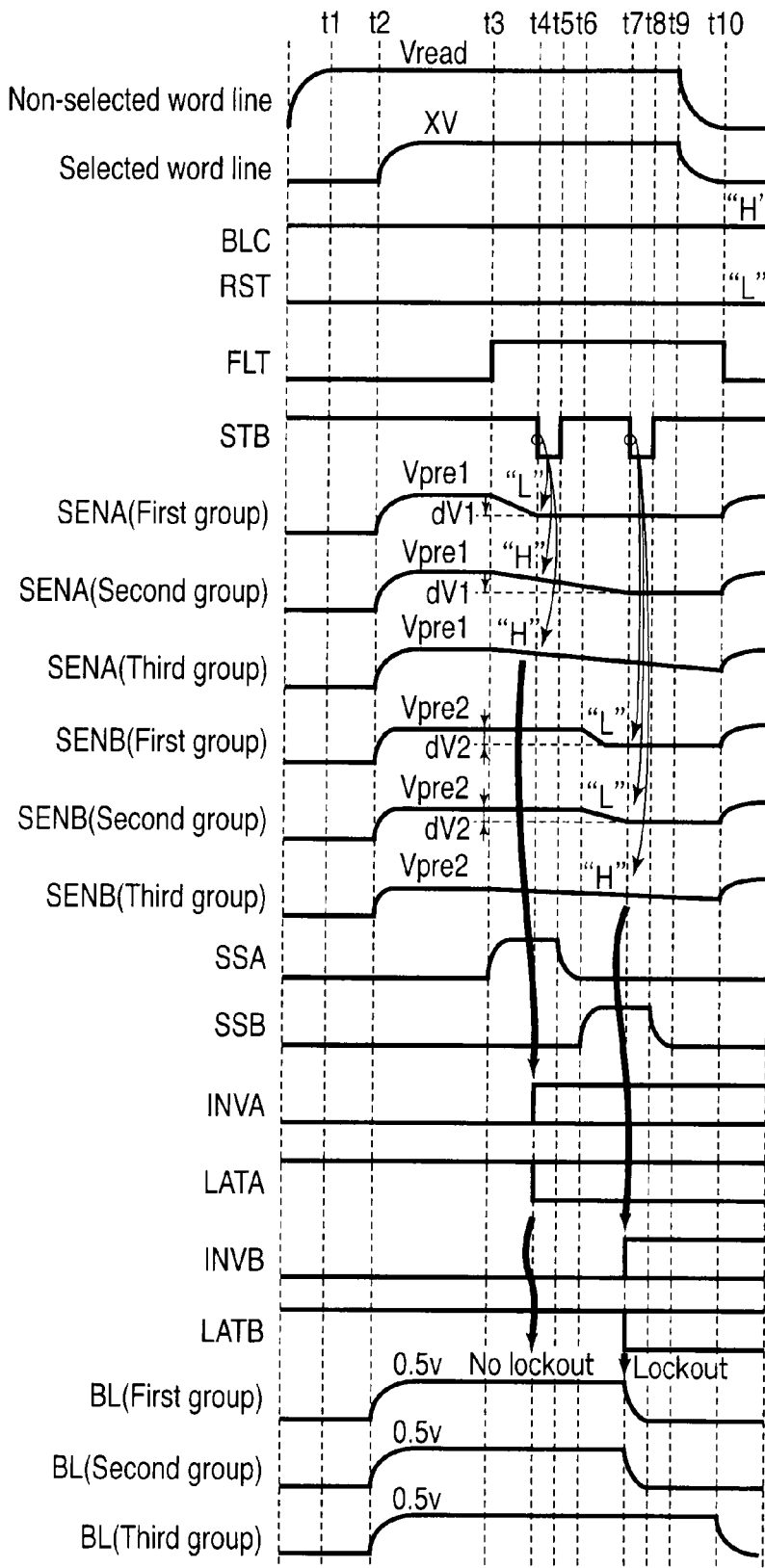
F I G. 20

NONVOLATILE SEMICONDUCTOR MEMORY

CROSS-REFERENCE TO RELATED APPLICATIONS

This application is based upon and claims the benefit of priority from prior Japanese Patent Application No. 2008-308608, filed Dec. 3, 2008, the entire contents of which are incorporated herein by reference.

BACKGROUND OF THE INVENTION

1. Field of the Invention

The present invention relates to a verify read operation of a nonvolatile semiconductor memory.

2. Description of the Related Art

A nonvolatile semiconductor memory in which one cell unit is composed of a plurality of memory cells, a NAND flash memory, for example (refer to U.S. Patent Application Publication No. 2004/0109357, for example) is required to narrow the width of a threshold distribution of the memory cell in a written state by lowering an operation voltage, and storing three or more values in one memory cell to implement a multi-level cell.

To satisfy this request, a write method such as QPW (Quick Pass Write) has been proposed. According to the technique of the QPW, the threshold voltage of the memory cell after written is classified to one of a first group in a first threshold range before completion of writing, a second group in a second threshold range higher than the first threshold range before completion of writing, and a third group in a third threshold range higher than the second threshold range after completion of writing, and a write condition is varied according to the three groups at the time of a rewrite operation.

For example, at the time of rewrite operation, a bit line is set to a first potential and a usual write operation is performed in the memory cell classified to the first group, a bit line is set to a second potential higher than the first potential and a write operation weaker (threshold shift width is smaller) than the usual write operation is performed in the memory cell classified to the second group, and a bit line is set to a third potential higher than the second potential and the write operation is inhibited in the memory cell classified to the third group.

However, since the threshold voltage of the memory cell after written is classified to one of the three groups in the QPW, two verify read operations are required.

For example, at the time of first verify read operation, a first verify read potential is applied to a selected word line and the threshold voltage of the memory cell after written is read to verify whether it belongs to the first group or not. Then, at the time of second verify read operation, a second verify read potential is applied to the selected word line, and the threshold voltage of the memory cell after written is read to verify whether it belongs to the second or third group.

Thus, since the two verify read operations are needed in the QPW, the problem is that a write time is increased. As for the multi-level nonvolatile semiconductor memory especially, since an operation of loading data in the memory cell is added before write operation, the increase in write time is a serious problem.

BRIEF SUMMARY OF THE INVENTION

A nonvolatile semiconductor memory according to an aspect of the present invention comprises first and second select gate transistors, memory cells connected in series between the first and second select gate transistors, a source line connected to the first select gate transistor, a bit line connected to the second select gate transistor, a selected word line which is connected to a selected memory cell as a target of a verify reading among the memory cells, a non-selected word line which is connected to a non-selected memory cell except the selected memory cell among the memory cells, a potential generating circuit for generating a selected read potential which is supplied to the selected word line, and generating a non-selected read potential larger than the selected read potential, which is supplied to the non-selected word line, and a control circuit which classifies a threshold voltage of the selected memory cell to one of three groups by verifying which area among three area which are isolated by two values does a cell current of the selected memory cell belong, when the selected read potential is a first value.

BRIEF DESCRIPTION OF THE SEVERAL VIEWS OF THE DRAWING

FIG. 1 is a diagram showing a nonvolatile semiconductor memory.

FIGS. 3 to 5 are diagrams, each showing a location of a memory cell array, a word line driver and a data circuit.

FIG. 11 is a diagram showing an operation waveform of the sense amplifier in FIG. 10.

FIG. 12 is a diagram showing a potential relationship in a write mode.

FIG. 20 is a diagram showing an operation waveform of the sense amplifier in FIG. 19.

DETAILED DESCRIPTION OF THE INVENTION

Figure 2:
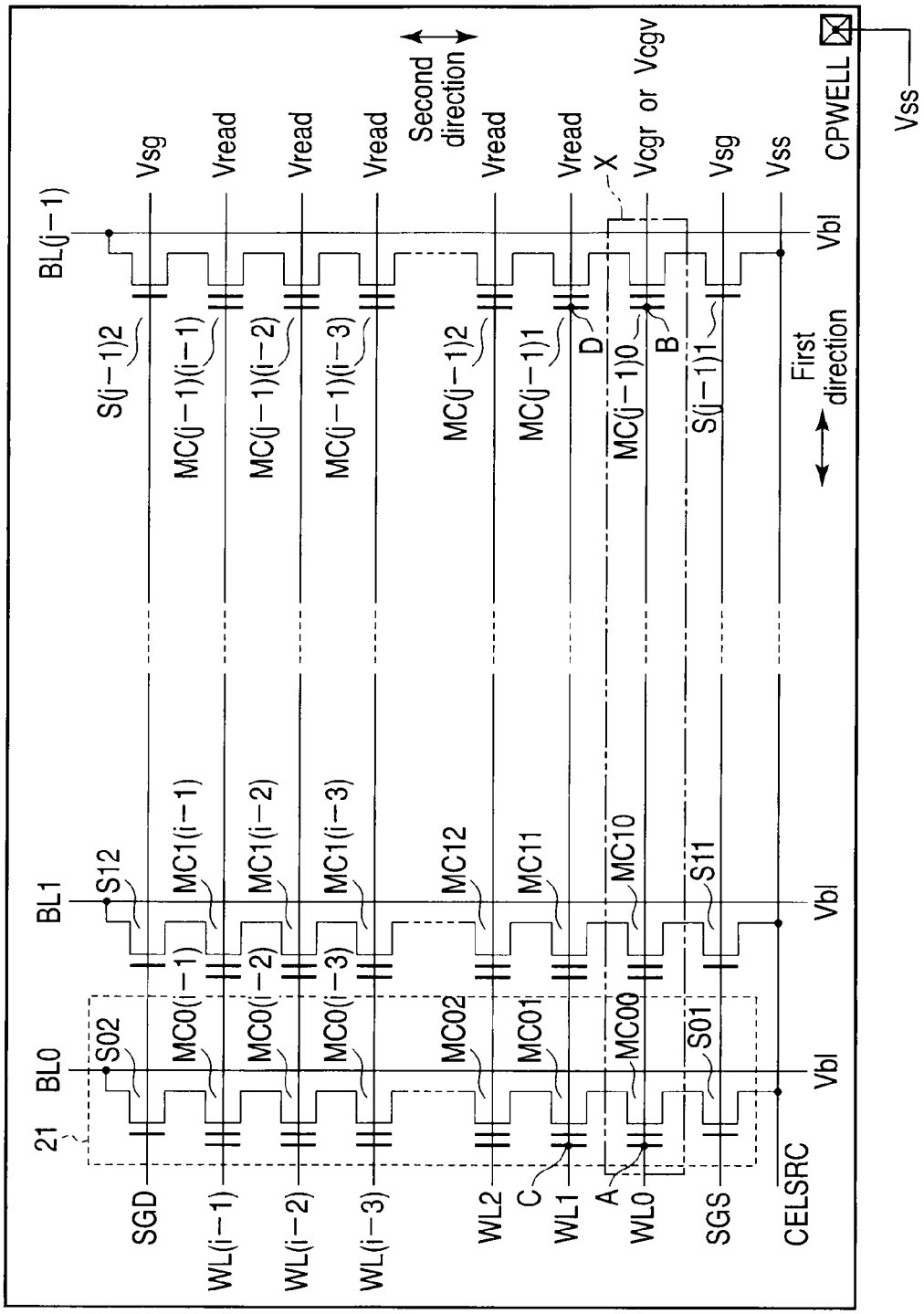
FIG. 2 is a diagram showing one NAND block.

A nonvolatile semiconductor memory of an aspect of the present invention will be described below in detail with reference to the accompanying drawing.

1. Outline

An example of the present invention is characterized by verifying three threshold states of a selected memory cell as a target of writing by one verify read in QPW (Quick Pass Write).

Specifically, a threshold voltage of the selected memory cell is classified to one of three groups by verifying which area among three area which are isolated by two values does a cell current of the selected memory cell belong, when the selected read potential is a first value, when a selected read potential which is supplied to the selected word line is constant.

A verification of the cell current of the selected memory cell is executed based on, for instance, a potential of the sense node at a first point after a first term from a start point which a discharge of the sense node is started by the cell current, and a potential of the sense node at a second point after a second term longer than the first term from the start point.

According to an example of the present invention, the threshold voltage of the selected memory cell is classified to the three groups by one verify reading. Therefore, a high speed of a write operation is realized by shortening of a term of the verify reading in comparison with the conventional technique which the threshold voltage of the selected memory cell is classified by two verify readings.

2. Nonvolatile Semiconductor Memory

First, a nonvolatile semiconductor memory which serves as a premise of the present invention will be described using a NAND flash memory as an example.

FIG. 1 shows a NAND flash memory. Memory cell array 11 has NAND blocks BK1, BK2, . . . BKn. Each of NAND blocks BK1, BK2, . . . BKn has NAND cell units.

Data circuit 12 has latch circuits (page buffers) which temporarily latch page data upon reading/writing. I/O (Input/Output) buffer 13 functions as an interface circuit for data, and address buffer 14 functions as an interface circuit for address signals.

The address signals include a block address signal, a row address signal, and a column address signal.

Row decoder 15 selects one of blocks BK1, BK2, . . . BKn based on a block address signal and selects one of word lines in the selected block based on a row address signal.

Word line driver 16 drives word lines in the selected block.

Column decoder 17 selects a predetermined number of latch circuits from the latch circuits based on a column address signal and connects the selected predetermined number of latch circuits to I/O buffer 13.

Verify circuit 18 verifies whether data is written properly upon writing. Verify circuit 18 compares data read from a selected memory cell upon verify reading with written data to determine whether writing has been completed.

Upon reading, potential generating circuit 19 generates a selected read potential which is supplied to a selected word line, and generates a non-selected read potential larger than the selected read potential, which is supplied to a non-selected word line.

Control circuit 20 controls the operations of data circuit 12, I/O buffer 13, address buffer 14, row decoder 15, word line driver 16, column decoder 17, verify circuit 18, and potential generating circuit 19.

FIG. 2 shows one NAND block in a memory cell array.

NAND cell unit 21 includes source line side select gate transistor S01, bit line side select gate transistor S02, and i (i is a natural number greater than or equal to 2) memory cells MC00, MC01, MC02, . . . MC0(i-3), MC0(i-2), and MC0(i-1) which are connected in series between source line side select gate transistor S01 and bit line side select gate transistor S02.

Two select gate lines SGS and SGD and i word lines WL0, WL1, WL2, . . . WL(i-3), WL(i-2), and WL(i-1) extend in a first direction. j (j is a natural number greater than or equal to 2) bit lines BL0, BL1, . . . BL(j-1) extend in a second direction orthogonal to the first direction.

Source line side select gate transistor S01 is connected to source line CELSRC and bit line side select gate transistor S02 is connected to bit line BL0.

The memory cell array is disposed in well region CPWELL.

Figure 5:
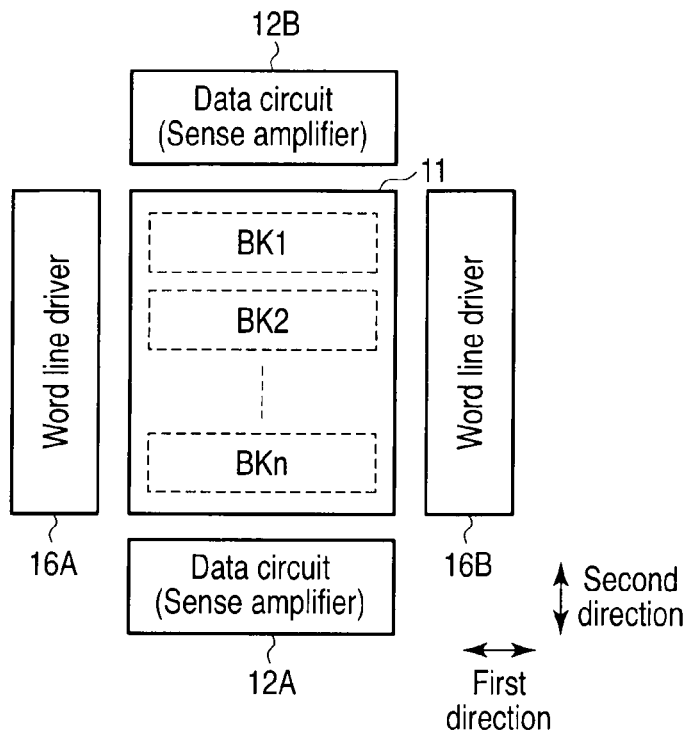

FIGS. 3 to 5 show a location relationship of a memory cell array, a word line driver and a data circuit.

In FIG. 3, word line driver 16 is disposed at one end in a first direction of memory cell array 11, and data circuit (sense amplifier) 12A, 12B are disposed at both ends in a second direction of memory cell array 11.

In FIG. 4, word line driver 16A, 16B are disposed at both ends in a first direction of memory cell array 11, and data circuit (sense amplifier) 12 is disposed at one end in a second direction of memory cell array 11.

In FIG. 5, word line driver 16A, 16B are disposed at both ends in a first direction of memory cell array 11, and data circuit (sense amplifier) 12A, 12B are disposed at both ends in a second direction of memory cell array 11.

Layouts in FIGS. 3 to 5 are applied, for example, an all bit line (ABL) sensing system which read page data by simultaneous driving all bit lines in memory cell array 11.

The important point is that an example of the present invention is characterized in that a selected read potential applied a selected word line is constant, and a threshold voltage of selected memory cell is classified based on a cell current which flows the selected memory cell.

In other words, a sense amplifier in a data circuit needs to use a current detecting type.

The ABL sensing system is different from a conventional sensing system (a voltage detecting type) which bit lines in a memory cell array comprises selected bit lines and shielded bit lines. The ABL sensing system is the current detecting type.

3. Principle of Present Invention

The present invention is based on QPW.

According to the technique of the QPW, in order to narrow the width of threshold distribution of a memory cell in a written state, the threshold voltage of the memory cell (selected memory cell) after written is classified into one of three groups and a write condition at the time of rewrite operation is varied based on this classification.

Figure 6:
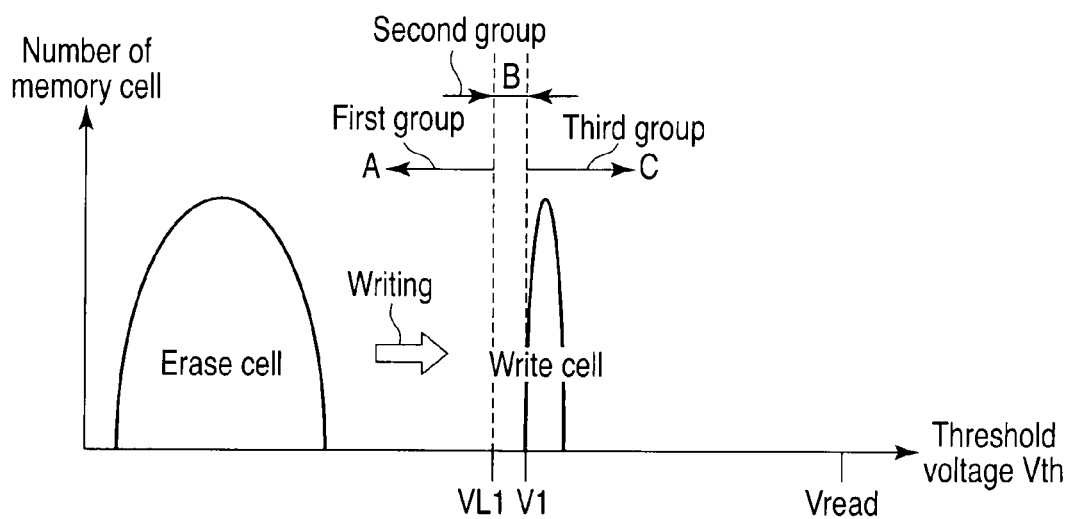
FIGS. 6 and 7 are diagrams, each showing a distribution of threshold voltages of memory cells.
Figure 7:
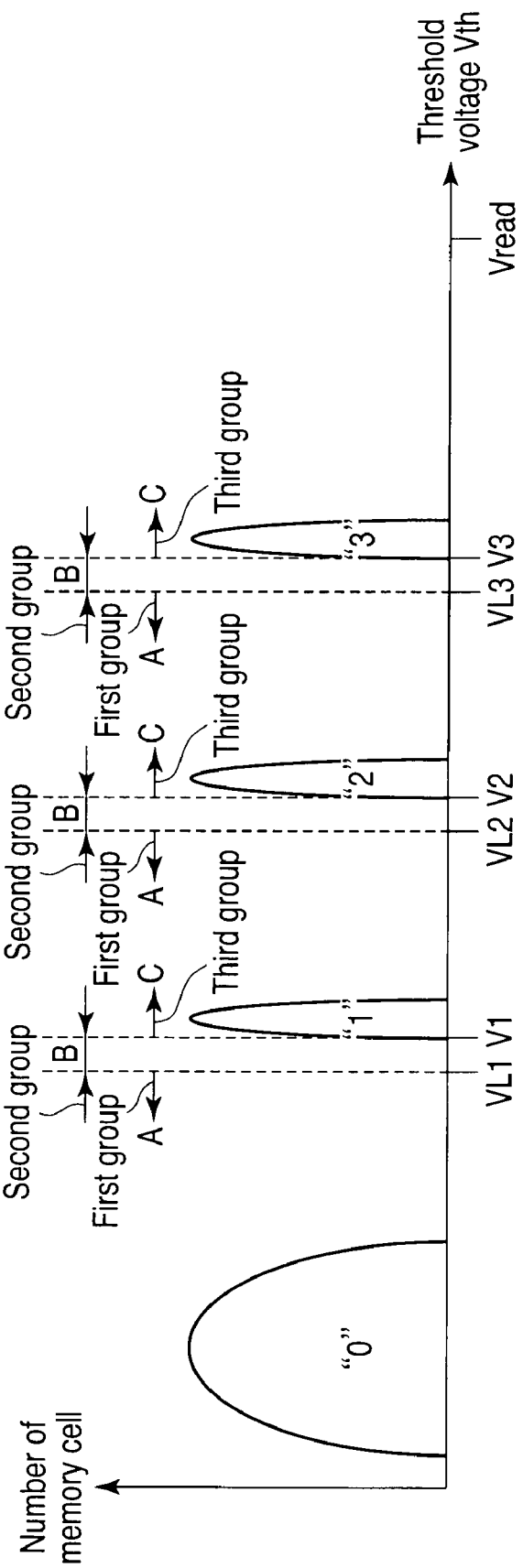

The three groups consist of a first group in which the threshold voltage of the selected memory cell is within a first threshold range A, a second group in which the threshold voltage of the selected memory cell is within a second threshold range B higher than the first threshold range A, and a third group in which the threshold voltage of the selected memory cell is within a third threshold range C higher than the second threshold range B as shown in FIG. 6 (two values) and FIG. 7 (four values).

The memory cell in the first group is a write-incomplete cell having a threshold voltage positioned far from the third threshold range as a target of writing. The memory cell in the second group is a write-incomplete cell (referred to as the QPW cell) having a threshold voltage positioned close to the third threshold group as the target of writing. Furthermore, the memory cell in the third group is a write-complete cell in the third threshold range as the target of writing.

Thus, at the time of rewrite operation, for the write-incomplete cell classified to the first group, a bit line is set to a first potential and a usual write operation is performed, and for the QPW cell classified to the second group, a bit line is set to a second potential higher than the first potential and a write operation weaker (threshold shift width is smaller) than the usual write operation is performed.

In addition, for the write-complete cell classified to the third group, a bit line is set to a third potential higher than the second potential and a write operation is inhibited.

Here, according to the conventional QPW, as shown in FIGS. 6 and 7, two verify read operations are performed using two values (V1/VL1, V2/VL2 and V3/VL3) as selected read potentials applied to the selected word line.

In addition, a non-selected read potential Vread higher than the selected read potential is applied to a non-selected word line.

Figure 8:
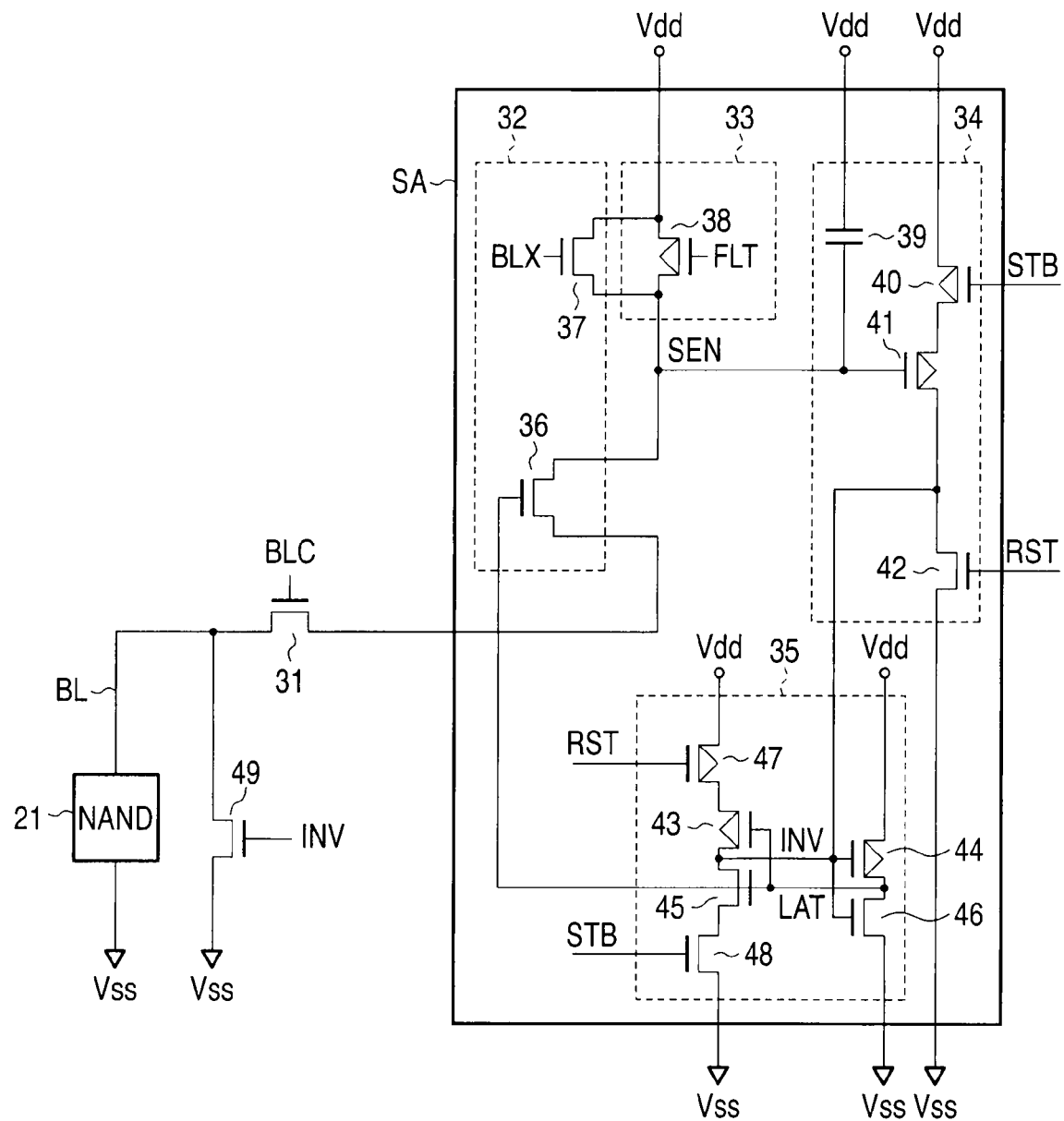
FIG. 8 is a diagram showing a conventional sense amplifier.

FIG. 8 shows a first example of a conventional sense amplifier applied to the ABL sense method.

This sense amplifier SA is composed of clamp circuit 32, precharge circuit 33, discrimination circuit (discriminator) 34, and latch circuit 35.

Clamp circuit 32 includes N channel MOS transistors 36 and 37. Precharge circuit 33 includes P channel MOS transistor 38. Discrimination circuit 34 includes P channel MOS transistors 40 and 41, N channel MOS transistor 42, and capacitor 39.

Latch circuit 35 has flip-flop-connected two inverters, that is, P channel MOS transistors 43 and 44 and N channel MOS transistors 45 and 46. P channel MOS transistor 47 and N channel MOS transistor 48 are used to control activation/inactivation of latch circuit 35.

N channel MOS transistor 31 as a clamp circuit is connected between sense amplifier SA and bit line BL. NAND cell unit 21 is connected to bit line BL. N channel MOS transistor 49 is used to discharge bit line BL.

Figure 9:
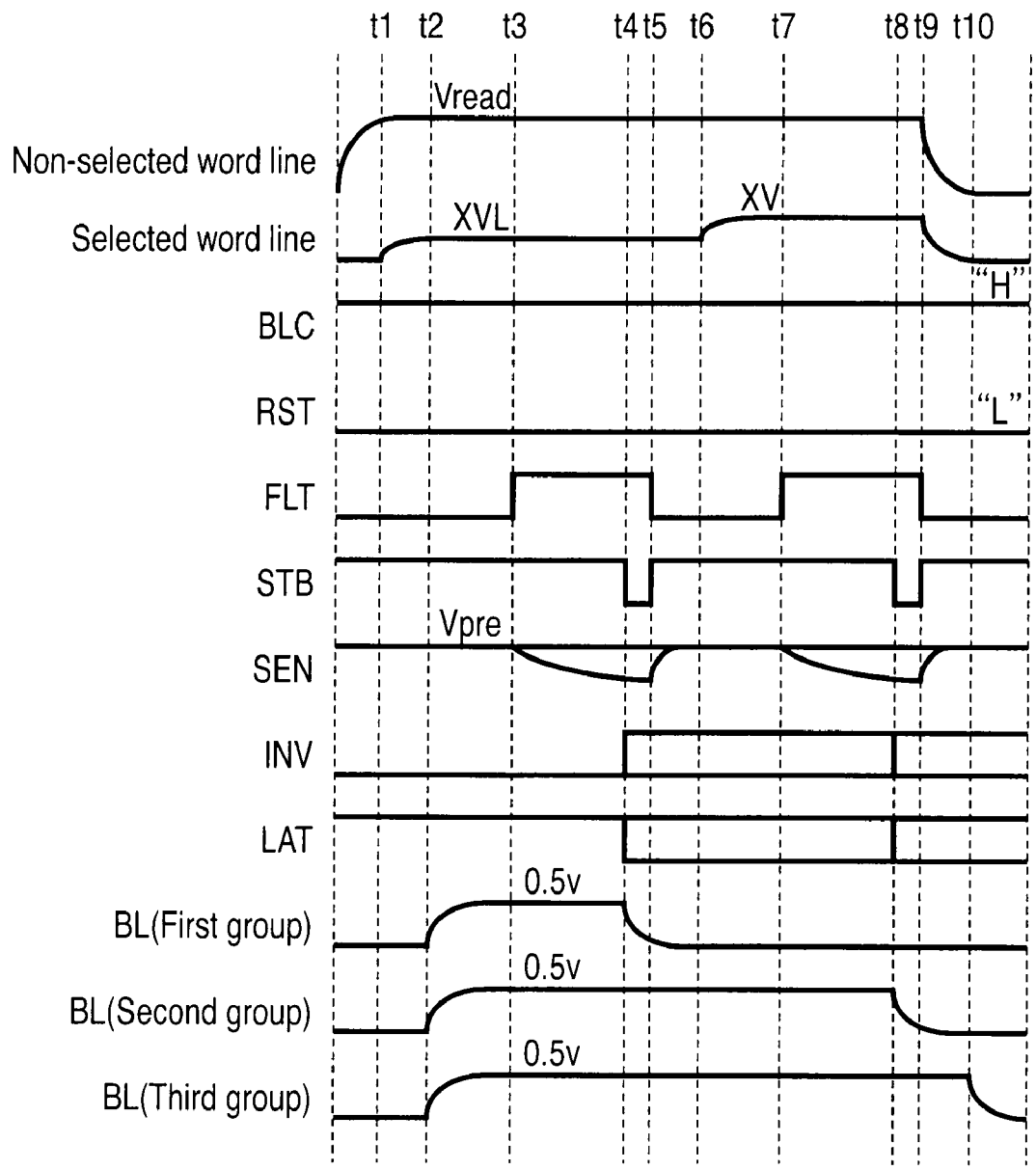
FIG. 9 is a diagram showing an operation waveform of the sense amplifier in FIG. 8.

FIG. 9 shows an operation waveform of the sense amplifier shown in FIG. 8.

A first verify read operation is performed from time t1 to t5, and a second verify read operation is performed from time t6 to t10.

At the time of first verify read operation, XVL (VL1, for example) is applied to a selected word line as a selected read potential, and non-selected read potential Vread (5 to 7 V, for example) higher than the selected read potential is applied to a non-selected word line to discriminate a write-incomplete cell (first group).

Sense node SEN is set to precharge potential Vpre previously. When control signal FLT is set to "H" under the condition that bit line BL is fixed to a constant potential (0.5 V, for example), the potential of sense node SEN becomes as described below according to the threshold voltage of a selected memory cell.

That is, when the threshold voltage of the selected memory cell is lower than the selected read potential, a cell current flows in the selected memory cell, and the potential of sense node SEN is lowered. Meanwhile, when the threshold voltage of the selected memory cell is higher than the selected read potential, the cell current does not flow in the selected memory cell and the potential of sense node SEN is not changed.

Therefore, when control signal STB is set to "L" after a certain period of time has passed since control signal FLT is set to "H", the potential of sense node SEN is latched to the latch circuit.

For example, when the selected memory cell is the write-incomplete cell (first group), its threshold voltage is lower than the selected read potential, so that the cell current flows in the selected memory cell, and the potential of sense node SEN is lowered. Therefore, input node INV of the latch circuit becomes "H" and output node LAT of the latch circuit becomes "L".

Then, N channel MOS transistor 36 is turned off, and sense node SEN is disconnected from bit line BL (lockout operation). In addition, N channel MOS transistor 49 is turned on, and bit line BL is discharged.

In addition, when the selected memory cell is a QPW cell (second group) or a write-complete cell (third group), its threshold voltage is higher than the selected read potential, so that the cell current does not flow in the selected memory cell, and the potential of sense node SEN is not changed. Therefore, input node INV of the latch circuit is kept at "L", and output node LAT of the latch circuit becomes "H".

Thus, the write-incomplete cell (first group) is discriminated by the first verify read operation.

At the time of second verify read operation, XV (V1, for example) is applied to the selected word line as the selected read potential and read potential Vread higher than the selected read potential is applied to the non-selected word line to discriminate the QPW cell (second group) and the write-complete cell (third group).

When control signal FLT is set to "H" under the condition that bit line BL is fixed to a constant potential (0.5 V, for example), the potential of sense node SEN becomes as described below according to the threshold voltage of the selected memory cell.

That is, when the threshold voltage of the selected memory cell is lower than the selected read potential, the cell current flows in the selected memory cell, and the potential of sense node SEN is lowered. Meanwhile, when the threshold voltage of the selected memory cell is higher than the selected read potential, the cell current does not flow in the selected memory cell, and the potential of sense node SEN is not changed.

Therefore, when control signal STB is set to "L" after a certain period of time has passed since control signal FLT is set to "H", the potential of sense node SEN is latched to the latch circuit.

For example, when the selected memory cell is the write-incomplete cell (first group) or the QPW cell (second group), its threshold voltage is lower than the selected read potential, so that the cell current flows in the selected memory cell, and the potential of sense node SEN is lowered. Therefore, input node INV of the latch circuit becomes "H" and output node LAT of the latch circuit becomes "L".

Then, N channel MOS transistor 36 is turned off, and sense node SEN is disconnected from bit line BL (lockout operation). In addition, N channel MOS transistor 49 is turned on, and bit line BL is discharged.

In addition, when the selected memory cell is the write-complete cell (third group), its threshold voltage is higher than the selected read potential, so that the cell current does not flow in the selected memory cell, and the potential of sense node SEN is not changed. Therefore, input node INV of the latch circuit is kept at "L", and output node LAT of the latch circuit becomes "H".

Thus, the QPW cell (second group) and the write-complete cell (third group) are discriminated by the second verify read operation.

Figure 10:
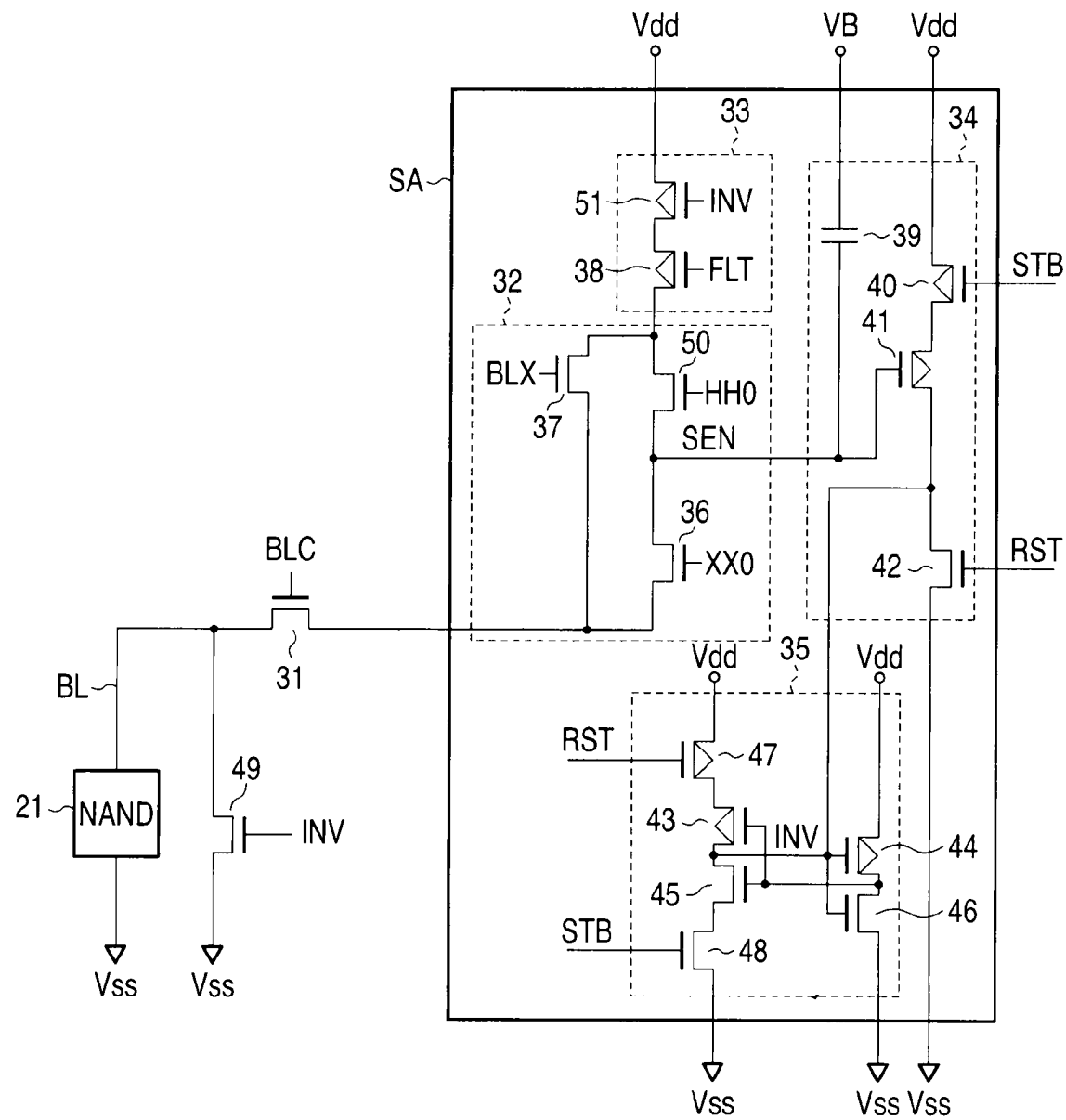
FIG. 10 is a diagram showing a conventional sense amplifier.

FIG. 10 shows a second example of a conventional sense amplifier applied to the ABL sense method.

This sense amplifier SA is composed of clamp circuit 32, precharge circuit 33, discrimination circuit (discriminator) 34, and latch circuit 35.

Clamp circuit 32 includes N channel MOS transistors 36, 37, and 50. Precharge circuit 33 includes P channel MOS transistors 38 and 51. Discrimination circuit 34 includes P channel MOS transistors 40 and 41, N channel MOS transistor 42, and capacitor 39.

Latch circuit 35 has two flip-flop-connected inverters, that is, P channel MOS transistors 43 and 44 and N channel MOS transistors 45 and 46. P channel MOS transistor 47 and N channel MOS transistor 48 are used to control activation/inactivation of latch circuit 35.

N channel MOS transistor 31 as a clamp circuit is connected between sense amplifier SA and bit line BL.

NAND cell unit 21 is connected to bit line BL. N channel MOS transistor 49 is used to discharge bit line BL.

FIG. 11 shows an operation waveform of the sense amplifier shown in FIG. 10.

A first verify read operation is performed from time t1 to t5, and a second verify read operation is performed from time t6 to t10.

At the time of first verify read operation, XVL (VL1, for example) is applied to a selected word line as a selected read potential, and non-selected read potential Vread (5 to 7 V, for example) higher than the selected read potential is applied to a non-selected word line to discriminate a write-incomplete cell (first group).

Sense node SEN is set to precharge potential Vpre previously. When control signal HHO is set to "L" and control signal VB is set to "H" under the condition that bit line BL is fixed to a constant potential (0.5 V, for example), the potential of sense node SEN is raised due to capacity coupling.

Then, the potential of sense node SEN becomes as described below according to the threshold voltage of a selected memory cell.

That is, when the threshold voltage of the selected memory cell is lower than the selected read potential, the cell current flows in the selected memory cell, and the potential of sense node SEN is lowered. Meanwhile, when the threshold voltage of the selected memory cell is higher than the selected read potential, the cell current does not flow in the selected memory cell, and the potential of sense node SEN is not changed.

Therefore, when control signal XXO is set to "L" and then control signal STB is set to "L" after a certain period of time has passed since control signal HHO is set to "L", the potential of sense node SEN is latched to the latch circuit.

For example, when the selected memory cell is the write-incomplete cell (first group), its threshold voltage is lower than the selected read potential, so that the cell current flows in the selected memory cell, and the potential of sense node SEN is lowered. Therefore, input node INV of the latch circuit becomes "H" and output node LAT of the latch circuit becomes "L".

In addition, when the selected memory cell is a QPW cell (second group) or a write-complete cell (third group), its threshold voltage is higher than the selected read potential, so that the cell current does not flow in the selected memory cell, and the potential of sense node SEN is not changed. Therefore, input node INV of the latch circuit is kept at "L", and output node LAT of the latch circuit becomes "H".

Thus, the write-incomplete cell (first group) is discriminated by the first verify read operation.

At the time of second verify read operation, XV (V1, for example) is applied to the selected word line as the selected read potential and non-selected read potential Vread higher than the selected read potential is applied to the non-selected word line to discriminate the QPW cell (second group) and the write-complete cell (third group).

When control signal HHO is set to "L" and control signal VB is set to "H" under the condition that bit line BL is fixed to a constant potential (0.5 V, for example), the potential of sense node SEN is raised due to capacity coupling.

Then, the potential of sense node SEN becomes as described below according to the threshold voltage of the selected memory cell.

That is, when the threshold voltage of the selected memory cell is lower than the selected read potential, the cell current flows in the selected memory cell, and the potential of sense node SEN is lowered. Meanwhile, when the threshold voltage of the selected memory cell is higher than the selected read potential, the cell current does not flow in the selected memory cell, and the potential of sense node SEN is not changed.

Therefore, when control signal XXO is set to "L" and control signal STB is set to "L" after a certain period of time has passed since control signal HHO is set to "L", the potential of sense node SEN is latched to the latch circuit.

For example, when the selected memory cell is the write-incomplete cell (first group) or the QPW cell (second group), its threshold voltage is lower than the selected read potential, so that the cell current flows in the selected memory cell, and the potential of sense node SEN is lowered. Therefore, input node INV of the latch circuit becomes "H" and output node LAT of the latch circuit becomes "L".

In addition, when the selected memory cell is the write-complete cell (third group), its threshold voltage is higher than the selected read potential, so that the cell current does not flow in the selected memory cell, and the potential of sense node SEN is not changed. Therefore, input node INV of the latch circuit is kept at "L", and output node LAT of the latch circuit becomes "H".

Thus, the QPW cell (second group) and the write-complete cell (third group) are discriminated by the second verify read operation.

FIG. 12 shows a potential relationship at the time of write operation after the verify read operation.

When the threshold voltage of the selected memory cell is classified to the first group (write-incomplete cell) at the time of write operation after the verify read operation, bit line BL is set to a first potential (ground potential Vss, for example), and then write potential Vpgm is applied to the selected word line.

In this case, the first potential is transmitted from bit line BL to a channel of the selected memory cell first. In addition, even when write potential Vpgm is applied to the selected word line, a bit line-side select gate transistor is on, and the channel is fixed to the first potential.

Therefore, a high voltage is applied between the selected word line and the channel (inversion layer of semiconductor substrate) in the selected memory cell, and the usual write operation is performed.

In addition, when the threshold voltage of the selected memory cell is classified to the second group (QPW cell), bit line BL is set to a second potential (Vb1, for example) higher than the first potential, and then write potential Vpgm is applied to the selected word line.

In this case, the second potential is transmitted from bit line BL to the channel of the selected memory cell first. In addition, even when write potential Vpgm is applied to the selected word line, a bit line-side select gate transistor is on, and the channel is fixed to the second potential.

Therefore, a voltage lower than that of the usual write operation is applied between the selected word line and the channel (inversion layer of semiconductor substrate) in the selected memory cell, and a write operation weaker (threshold shift width is smaller) than the usual write operation is performed.

Furthermore, when the threshold voltage of the selected memory cell is classified to the third group (write-complete cell), bit line BL is set to a third potential (Vinhibit, for example) higher than the second potential, and then write potential Vpgm is applied to the selected word line.

In this case, the third potential is transmitted from bit line BL to the channel of the selected memory cell first. In addition, as the potential of the selected word line is raised, the channel becomes a little higher than the third potential, and the bit line-side select gate transistor is cut off. Therefore, when the selected word line reaches write potential Vpgm, the channel reaches Vinhibit+$\alpha$ ($\alpha$ is a potential variation due to capacity coupling).

Therefore, a high voltage required for the write operation is not applied between the selected word line and the channel (inversion layer of semiconductor substrate) in the selected memory cell, so that the write operation is inhibited.

Figure 13:
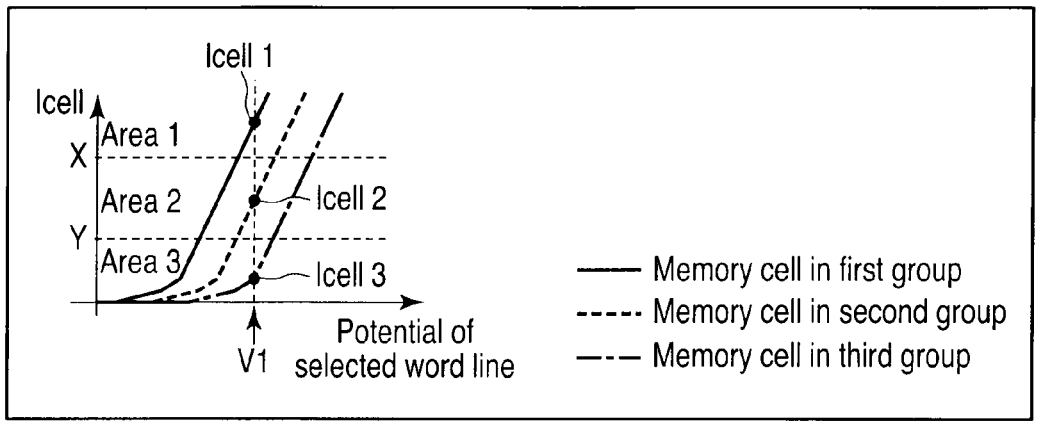
FIGS. 13 and 14 are diagrams, each showing a principle of the present invention.
Figure 14:
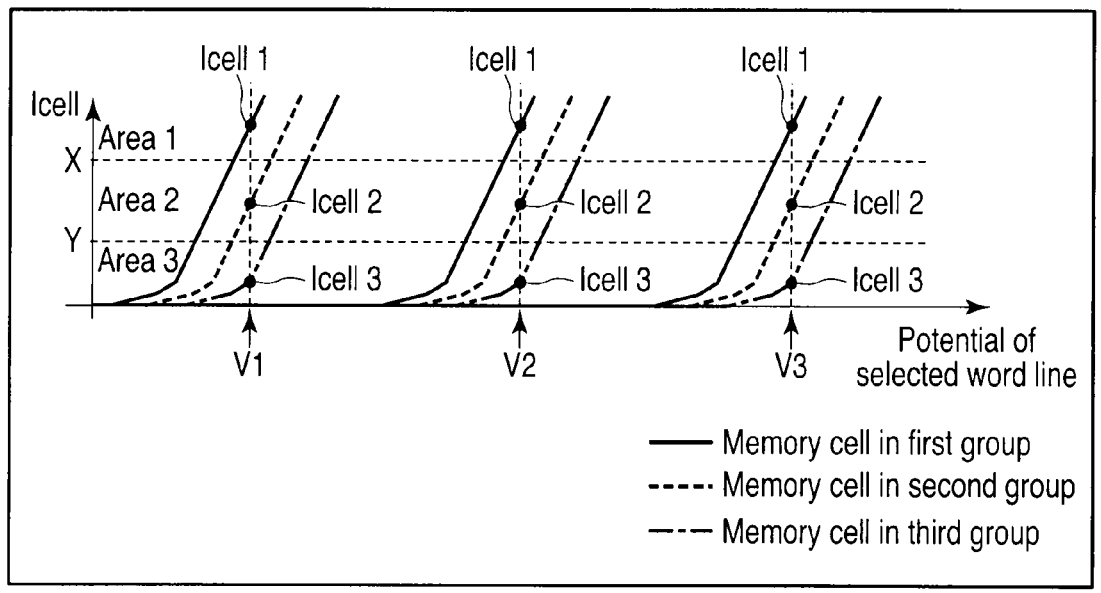

FIGS. 13 and 14 show the principle of a verify read operation according to the example of the present invention. FIG. 13 corresponds to FIG. 6, and FIG. 14 corresponds to FIG. 7.

According to the example of the present invention, when QPW is executed, the threshold state of a selected memory cell as a target of writing is classified to one of three groups by one verify read operation.

More specifically, under the condition that a selected read potential applied to a selected word line is set to a constant value (V1, for example), the threshold voltage of the selected memory cell is classified to one of the first to third groups shown in FIGS. 6 and 7 by verifying to which one of three areas (area 1/area 2/area 3) divided by two values X and Y cell current Icell flowing in the selected memory cell belongs.

For example, when the selected read potential is V1, a cell current flowing in the memory cell in the first group (write-incomplete cell) is Icell1, and a cell current flowing in the memory cell in the second group (QPW cell) is Icell2, and the cell current flowing in the memory cell in the third group (write-complete cell) is Icell3.

Here, it is to be noted that Icell1>Icell2>Icell3.

According to the conventional QPW, the two values are used as the selected read potential, and it is detected whether the cell current flows in the selected memory cell or not with respect to each value. In other words, according to the conventional QPW, the two verify read operations are needed because it is detected whether the cell current flows or not.

Meanwhile, according to the example of the present invention, the threshold voltage of the selected memory cell is classified to one of three groups through the one verify read operation, not by verifying whether the cell current flows or not, but by verifying the magnitude of the current cell.

The magnitude of the cell current flowing in the selected memory cell is verified, for example, based on the potential of a sense node at a first point after a first period has passed since a discharge start time to start discharge from the sense node by the cell current flowing in the selected memory cell, and the potential of the sense node at a second point after a second period longer than the first period has passed since the discharge start time, under the condition that the sense node has been charged previously.

According to the example in the present invention, since the threshold voltage of the selected memory cell can be classified by the one verify read operation, a setup period to change the potential of the selected word line, and a recovery period of the bit line after the lockout operation are not needed unlike the case where the threshold voltage of the selected memory cell is classified through the two verify read operations.

Therefore, a write operation can be performed at high speed because a verify read time is shortened.

4. Embodiments (1) First Embodiment

Figure 15:
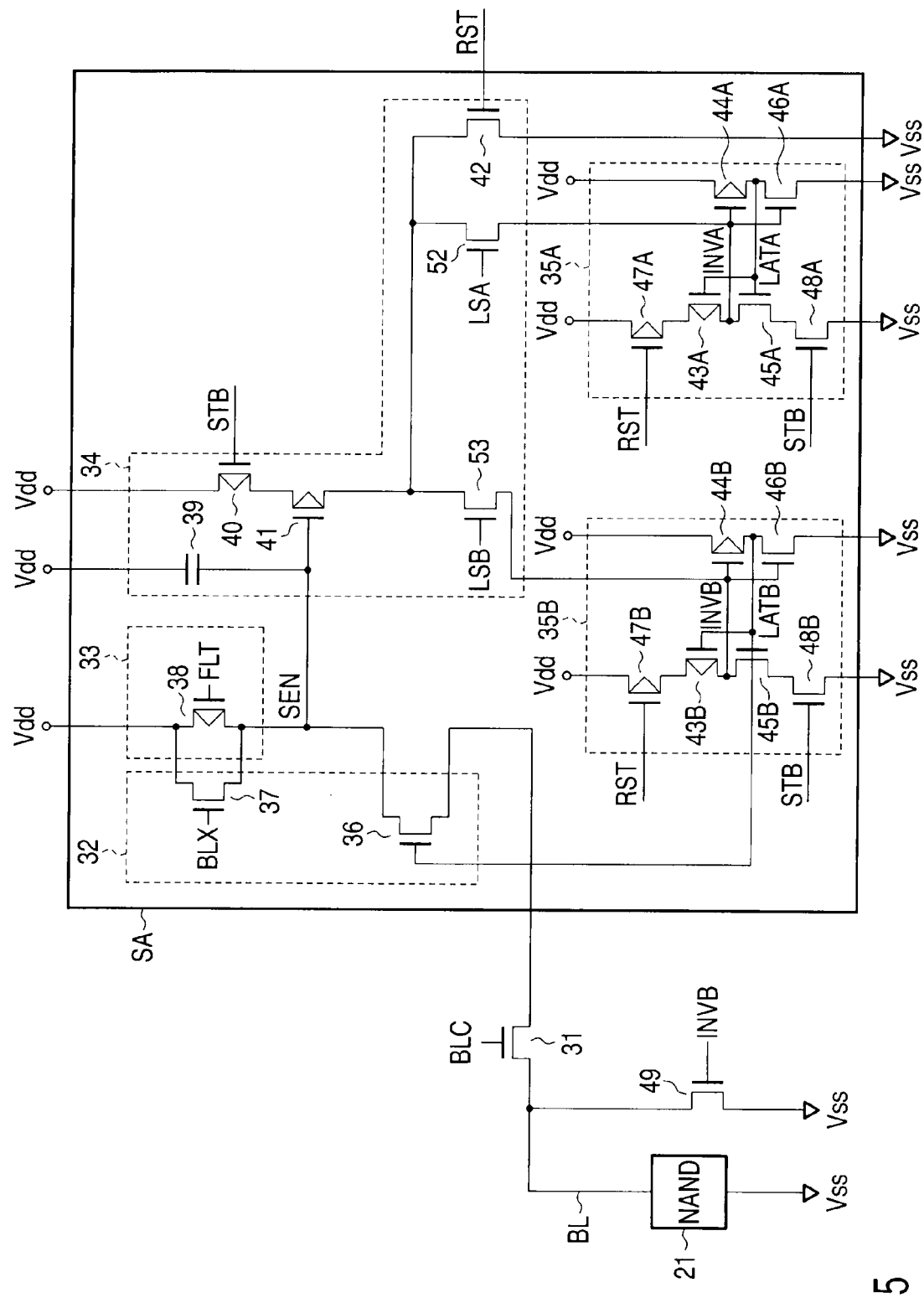
FIG. 15 is a diagram showing a sense amplifier of a first embodiment.

FIG. 15 shows a sense amplifier according to a first embodiment.

This sense amplifier SA is applied to the ABL sense method and this is an improved example of the conventional sense amplifier shown in FIG. 8.

Sense amplifier SA is composed of clamp circuit 32, precharge circuit 33, discrimination circuit (discriminator) 34, and latch circuits 35A and 35B.

Clamp circuit 32 includes N channel MOS transistors 36 and 37. Precharge circuit 33 includes P channel MOS transistor 38. Discrimination circuit 34 includes P channel MOS transistors 40 and 41, N channel MOS transistors 42 and 53, and capacitor 39.

Latch circuit 35A has flip-flop-connected two inverters, that is, P channel MOS transistors 43A and 44A and N channel MOS transistors 45A and 46A. P channel MOS transistor 47A and N channel MOS transistor 48A are used to control activation/inactivation of latch circuit 35A.

The potential of sense node SEN is latched to latch circuit 35A through N channel MOS transistor 52. The data latched to latch circuit 35A is not used for a lockout operation which forces sense node SEN to be disconnected from the bit line.

Latch circuit 35B has flip-flop-connected two inverters, that is, P channel MOS transistors 43B and 44B and N channel MOS transistors 45B and 46B. P channel MOS transistor 47B and N channel MOS transistor 48B are used to control activation/inactivation of latch circuit 35B.

The potential of sense node SEN is latched to latch circuit 35B through N channel MOS transistor 53. The data latched to latch circuit 35B is used for the lockout operation to forcedly disconnect sense node SEN from the bit line.

N channel MOS transistor 31 as a clamp circuit is connected between sense amplifier SA and bit line BL. NAND cell unit 21 is connected to bit line BL. N channel MOS transistor 49 is used for discharging bit line BL. N channel MOS transistor 49 is turned on/off based on the data latched to latch circuit 35B.

Figure 16:
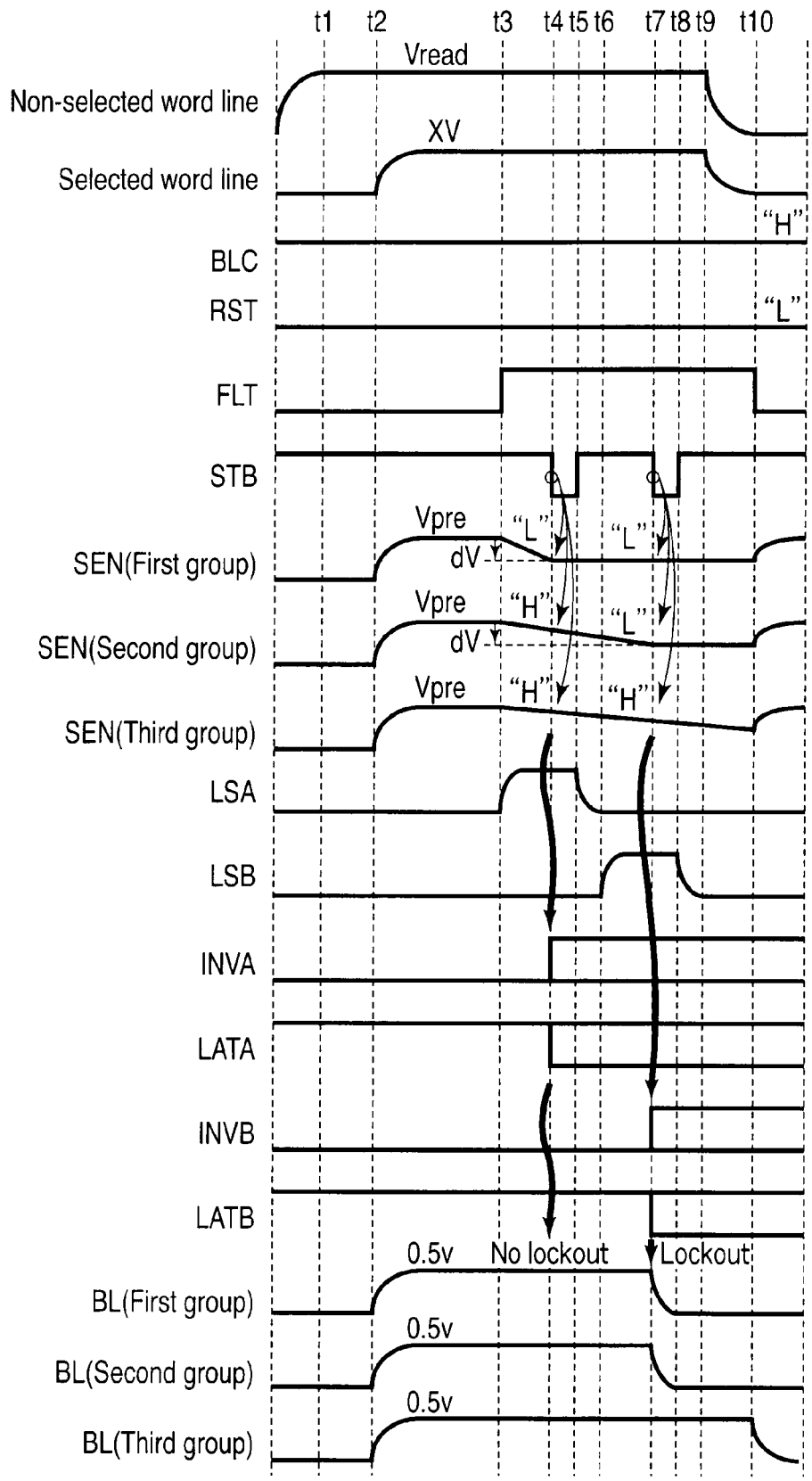
FIG. 16 is a diagram showing an operation waveform of the sense amplifier in FIG. 15.

FIG. 16 shows an operation waveform of the sense amplifier shown in FIG. 15.

First, XV (V1, for example) is applied to a selected word line as a selected read potential, and non-selected read potential Vread (5 to 7 V, for example) higher than the selected read potential is applied to a non-selected word line.

When control signal FLT is set to "H" under the condition that sense node SEN is charged to precharge potential Vpre and bit line BL is fixed to a constant potential (0.5 V, for example), the potential of sense node SEN becomes as described below according to the threshold voltage of the selected memory cell.

That is, when the threshold voltage of the selected memory cell is lower than the selected read potential, a large cell current flows in the selected memory cell, and the speed at which the potential of sense node SEN is lowered is increased. Meanwhile, when the threshold voltage of the selected memory cell is higher than the selected read potential, a small cell current flows in the selected memory cell or the cell current does not flow in the selected memory cell, so that the speed at which the potential of sense node SEN is lowered is decreased.

Thus, control signal LSA is set to "H" and N channel MOS transistor 52 shown in FIG. 15 is turned on first. Then, when control signal STB is set to "L" at first point t4 after a first period has passed since discharge start time t3 to start discharge from sense node SEN, that is, after the first period has passed since control signal FLT is set to "H", the potential of sense node SEN is latched to latch circuit 35A shown in FIG. 15.

For example, when the selected memory cell is a write-incomplete cell (first group), its threshold voltage is lower than the selected read potential and a difference between them is large, so that a large cell current flows in the selected memory cell. Thus, the potential of sense node SEN is lowered rapidly, and a potential drop amount reaches dV before time t4, at which sense node SEN becomes "L".

Therefore, input node INVA of latch circuit 35A becomes "H" and output node LATA of latch circuit 35A becomes "L". Here, it is to be noted that at this time, the lockout operation to forcedly disconnect sense node SEN from bit line BL to discharge bit line BL is not performed.

When the selected memory cell is a QPW cell (second group), its threshold voltage is lower than the selected read potential and a difference between them is small, so that a small cell current flows in the selected memory cell. Thus, the potential of sense node SEN is lowered moderately, and a potential drop amount does not reach dV before time t4, at which sense node SEN is kept at "H".

Therefore, input node INVA of latch circuit 35A becomes "L", and output node LATA of latch circuit 35A becomes "H".

Meanwhile, when the selected memory cell is a write-complete cell (third group), its threshold voltage is higher than the selected read potential, so that a very small cell current flows in the selected memory cell, or the cell current does not flow in the selected memory cell. Thus, the potential of sense node SEN is lowered moderately, and a potential drop amount does not reach dV before time t4, at which sense node SEN is kept at "H".

Therefore, input node INVA of latch circuit 35A becomes "L", and output node LATA of latch circuit 35A becomes "H".

As described above, the write-incomplete cell (first group) is discriminated.

Then, control signal LSA is set to "L" and N channel MOS transistor 52 shown in FIG. 15 is turned off.

Then, control signal LSB is set to "H" and N channel MOS transistor 53 shown in FIG. 15 is turned on. In addition, when control signal STB is set to "L" at second point t7 after a second period longer than the first period has passed since discharge start time t3 to start discharge from sense node SEN, that is, after the second period has passed since control signal FLT is set to "H", the potential of sense node SEN is latched to latch circuit 35B shown in FIG. 15.

For example, when the selected memory cell is the write-incomplete cell (first group), the potential of sense node SEN is lowered rapidly, so that a potential drop amount reaches dV before time t4, and sense node SEN is at "L" at time t7.

Therefore, input node INVB of latch circuit 35B becomes "H" and output node LATB of latch circuit 35B becomes "L".

Then, N channel MOS transistor 36 is turned off and sense node SEN is disconnected from bit line BL (lockout operation). In addition, N channel MOS transistor 49 is turned on and bit line BL is discharged.

When the selected memory cell is the QPW cell (second group), its threshold voltage is lower than the selected read potential and a difference between them is small, so that the cell current flowing in the selected memory cell is small. Thus, the potential of sense node SEN is lowered moderately, and a potential drop amount reaches dV before time t7, at which sense node SEN is at "L".

Therefore, input node INVB of latch circuit 35B becomes "H", and output node LATB of latch circuit 35B becomes "L".

Then, N channel MOS transistor 36 is turned off, and sense node SEN is disconnected from bit line BL (lockout operation). In addition, N channel MOS transistor 49 is turned on, and bit line BL is discharged.

Meanwhile, when the selected memory cell is the write-complete cell (third group), its threshold voltage is higher than the selected read potential, so that a very small cell current flows in the selected memory cell, or the cell current does not flow in the selected memory cell. Thus, the potential of sense node SEN is lowered moderately, and a potential drop amount does not reach dV before time t7, at which sense node SEN is still at "H".

Therefore, input node INVB of latch circuit 35B becomes "L", and output node LATB of latch circuit 35B becomes "H".

As described above, the QPW cell (second group) and the write-complete cell (third group) are discriminated.

Table 1 shows relationship between data INVA and INVB latched to the two latch circuits and the three groups.

TABLE 1

| INVA | INVB | Group |
|------|------|-------|
| H | H | First group (Area 1) |
| L | H | Second group (Area 2) |
| L | L | Third group (Area 3) |

When both INVA and INVB are at "H", it is verified that the selected memory cell belongs to the first group (area 1 in FIGS. 13 and 14) and is recognized as the write-incomplete cell.

When INVA is at "L" and INVB is at "H", it is verified that the selected memory cell belongs to the second group (area 2 in FIGS. 13 and 14) and is recognized as the QPW cell.

When both INVA and INVB are at "L", it is verified that the selected memory cell belongs to the third group (area 3 in FIGS. 13 and 14) and is recognized as the write-incomplete cell.

As described above, according to the first embodiment, the threshold voltage of the selected memory cell can be classified to one of the three groups through one verify read operation by use of the difference in magnitude of the sense current flowing in the selected memory cell.

Therefore, as is obvious from the waveform diagram in FIG. 16, since a setup period to change the potential of the selected word line, and a recovery period of the bit line after the lockout operation are not needed, a write operation can be performed at high speed due to the shortened verify read time.

(2) Second Embodiment

Figure 17:
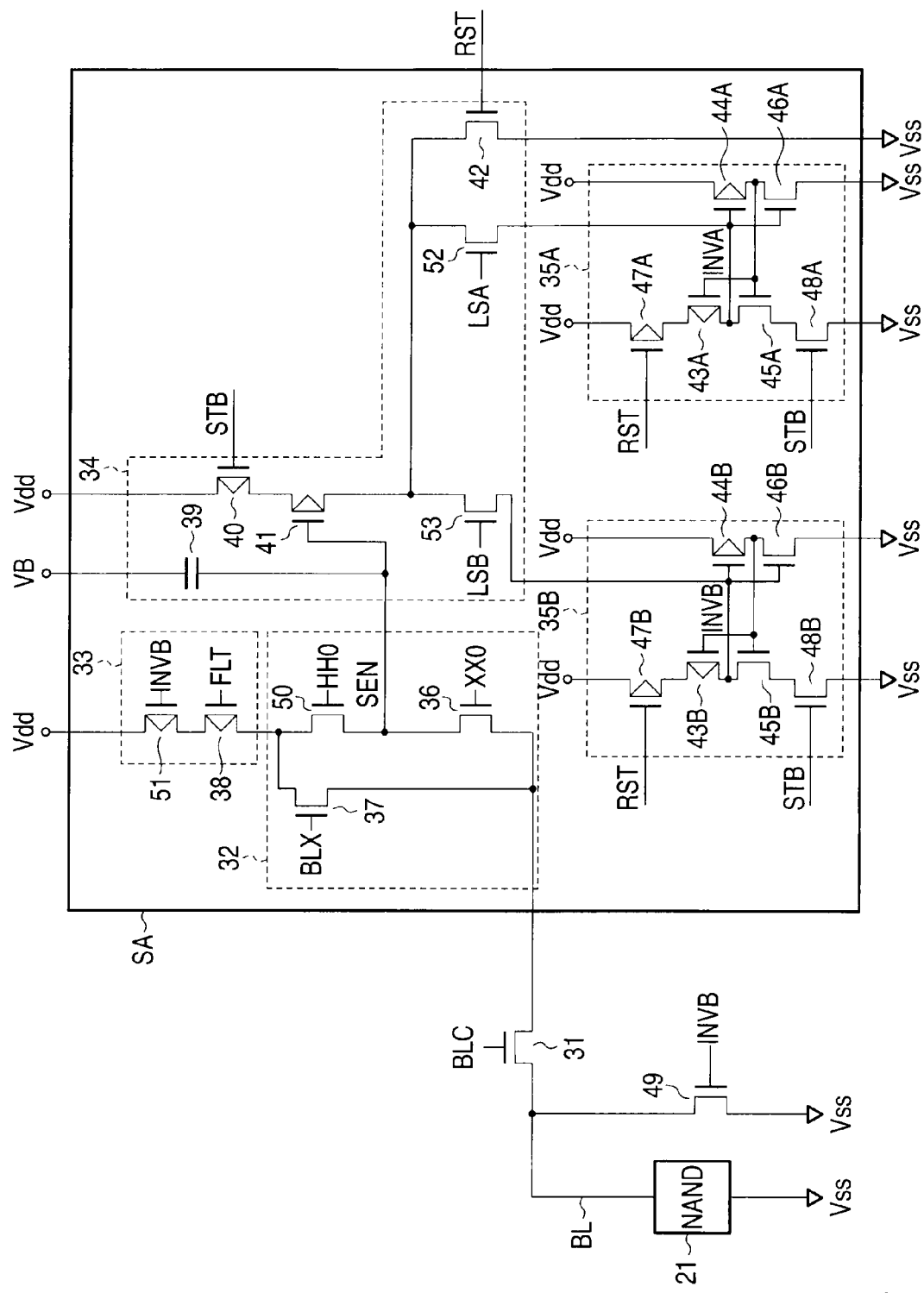
FIG. 17 is a diagram showing a sense amplifier of a second embodiment.

FIG. 17 shows a sense amplifier according to a second embodiment.

This sense amplifier SA is applied to the ABL sense method and this is an improved example of the conventional sense amplifier shown in FIG. 10.

Sense amplifier SA is composed of clamp circuit 32, precharge circuit 33, discrimination circuit (discriminator) 34, and latch circuits 35A and 35B.

Clamp circuit 32 includes N channel MOS transistors 36, 37, and 50. Precharge circuit 33 includes P channel MOS transistors 38 and 51. Discrimination circuit 34 includes P channel MOS transistors 40 and 41, N channel MOS transistors 42, 52, and 53, and capacitor 39.

Latch circuit 35A has flip-flop-connected two inverters, that is, P channel MOS transistors 43A and 44A and N channel MOS transistors 45A and 46A. P channel MOS transistor 47A and N channel MOS transistor 48A are used to control activation/inactivation of latch circuit 35A.

The potential of sense node SEN is latched to latch circuit 35A through N channel MOS transistor 52.

Latch circuit 35B has flip-flop-connected two inverters, that is, P channel MOS transistors 43B and 44B and N channel MOS transistors 45B and 46B. P channel MOS transistor 47B and N channel MOS transistor 48B are used to control activation/inactivation of latch circuit 35B.

The potential of sense node SEN is latched to latch circuit 35B through N channel MOS transistor 53.

N channel MOS transistor 31 as a clamp circuit is connected between sense amplifier SA and bit line BL. NAND cell unit 21 is connected to bit line BL. N channel MOS transistor 49 is used for discharging bit line BL. N channel MOS transistor 49 is turned on/off based on the data latched to latch circuit 35B.

Figure 18:
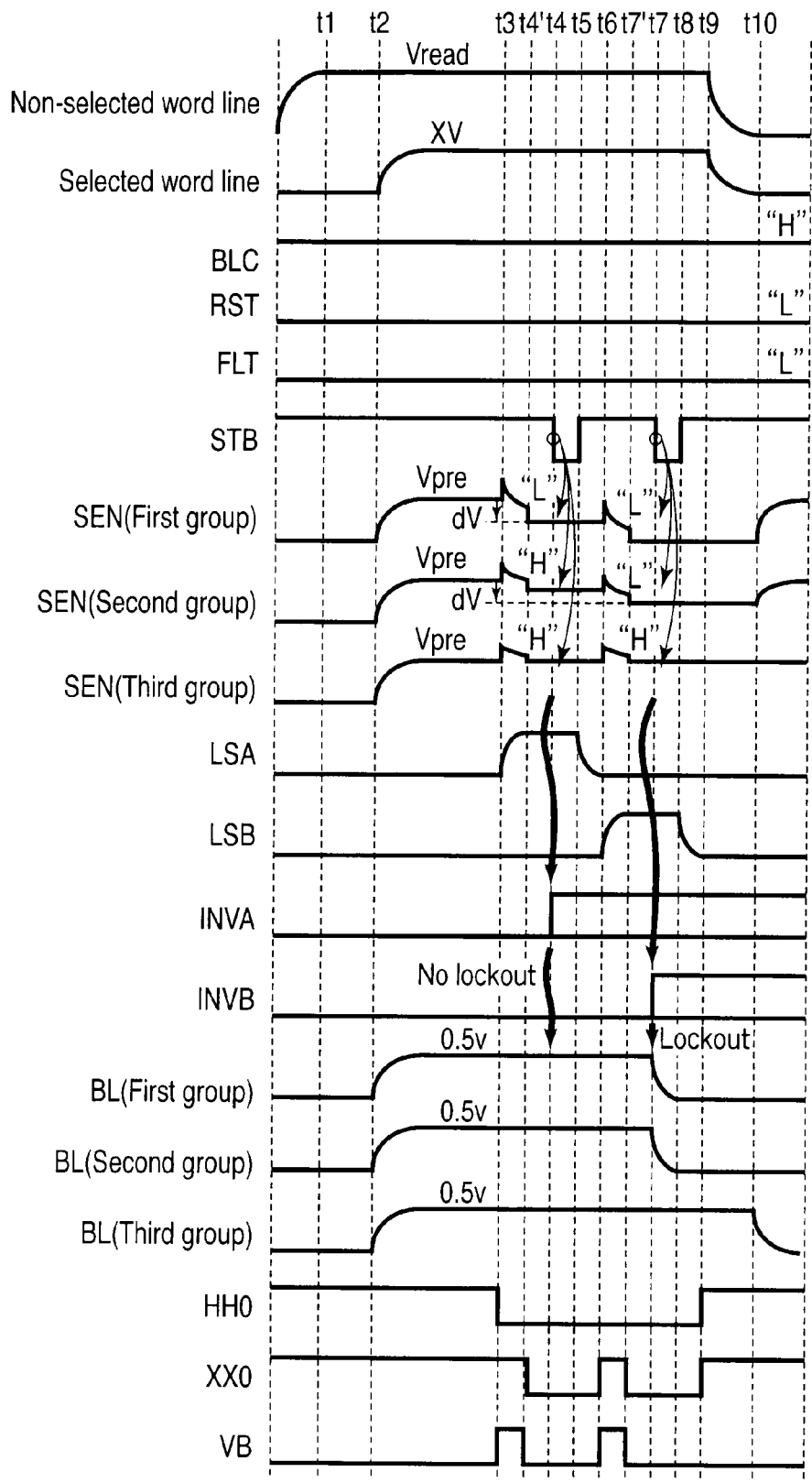
FIG. 18 is a diagram showing an operation waveform of the sense amplifier in FIG. 17.

FIG. 18 shows an operation waveform of the sense amplifier shown in FIG. 17.

First, XV (V1, for example) is applied to a selected word line as a selected read potential, and non-selected read potential Vread (5 to 7 V, for example) higher than the selected read potential is applied to a non-selected word line.

When control signal HHO is set to "L" and control signal VB is set to "H" under the condition that sense node SEN is charged to precharge potential Vpre and bit line BL is fixed to a constant potential (0.5 V, for example), the potential of sense node SEN is raised due to capacity coupling.

Then, the potential of sense node SEN becomes as described below according to the threshold voltage of the selected memory cell.

That is, when the threshold voltage of a selected memory cell is lower than the selected read potential, a large cell current flows in the selected memory cell, and the speed at which the potential of the sense node SEN is lowered is increased. Meanwhile, when the threshold voltage of the selected memory cell is higher than the selected read potential, a small cell current flows in the selected memory cell, or the cell current does not flow in the selected memory cell, so that the speed at which the potential of sense node SEN is lowered is decreased.

Therefore, control signal LSA is set to "H" and N channel MOS transistor 52 shown in FIG. 15 is turned on. In addition, when control signal STB is set to "L" at first point t4 after a first period has passed since discharge start time t3 to start discharge from sense node SEN, the potential of sense node SEN is latched to latch circuit 35A shown in FIG. 15.

For example, when the selected memory cell is a write-incomplete cell (first group), its threshold voltage is lower than the selected read potential and a difference between them is large, so that the large cell current flows in the selected memory cell. Thus, the potential of the sense node SEN is lowered rapidly, and a potential drop amount reaches dV before time t4.

Here, before control signal STB is set to "L", control signal VB is set to "L" at time t4' to lower the potential of sense node SEN by capacity coupling, so that P channel MOS transistor 41 can detect the potential change of sense node SEN.

Thus, the level of sense node SEN becomes "L" at time t4.

Therefore, P channel MOS transistor 41 is turned on, and input node INVA of latch circuit 35A becomes "H" and output node LATA of latch circuit 35A becomes Meanwhile, when the selected memory cell is a QPW cell (second group), its threshold voltage is lower than the selected read potential and a difference between them is small, so that a small cell current flows in the selected memory cell. Thus, the potential of sense node SEN is lowered moderately, and a potential drop amount does not reach dV before time t4.

Consequently, even when control signal VB is set to "L" at time t4', and the potential of sense node SEN is lowered by capacity coupling, the level of the sense node SEN is kept at "H" at time t4.

Therefore, P channel MOS transistor 41 is turned off, and input node INVA of latch circuit 35A becomes "L", and output node LATA of latch circuit 35A becomes "H".

Meanwhile, when the selected memory cell is a write-complete cell (third group), its threshold voltage is higher than the selected read potential, so that a very small cell current flows in the selected memory cell, or the cell current does not flow in the selected memory cell. Thus, the potential of sense node SEN is lowered moderately, and a potential drop amount does not reach dV before time t4.

Consequently, even when control signal VB is set to "L" at time t4', and the potential of sense node SEN is lowered by capacity coupling, the level of sense node SEN is kept at "H" at time t4.

Thus, P channel MOS transistor 41 is turned off, and input node INVA of latch circuit 35A becomes "L", and output node LATA of latch circuit 35A becomes "H".

As described above, the write-incomplete cell (first group) is discriminated first.

Then, control signal LSA is set to "L" and N channel MOS transistor 52 shown in FIG. 15 is turned off.

Then, control signal LSB is set to "H" and N channel MOS transistor 53 shown in FIG. 15 is turned on. In addition, when control signal STB is set to "L" at second point t7 after a second period longer than the first period has passed since discharge start time t3 to start discharge from sense node SEN, the potential of sense node SEN is latched to latch circuit 35B shown in FIG. 15.

For example, when the selected memory cell is the write-incomplete cell (first group), the potential of sense node SEN is lowered rapidly, and the potential drop amount reaches dV before time t4, so that sense node SEN is still at "L" at time t7 after control signal VB is set to "H" at time t6 and control signal VB is set to "L" at time t7'.

Thus, P channel MOS transistor 41 is turned on, and input node INVB of latch circuit 35B becomes "H" and output node LATB of latch circuit 35B becomes "L". Then, N channel MOS transistor 49 is turned on and bit line BL is discharged.

When the selected memory cell is the QPW cell (second group), its threshold voltage is lower than the selected read potential and a difference between them is small, so that a small cell current flows in the selected memory cell. Thus, the potential of sense node SEN is lowered moderately, and a potential drop amount reaches dV before time t7.

Thus, control signal VB is set to "H" at time t6, and control signal VB is set to "L" at time t7', after which sense node SEN becomes "L" at time t7.

Thus, P channel MOS transistor 41 is turned on, and input node INVB of latch circuit 35B becomes "H", and output node LATB of latch circuit 35B becomes "L". Then, N channel MOS transistor 49 is turned on, and bit line BL is discharged.

Meanwhile, when the selected memory cell is the write-complete cell (third group), its threshold voltage is higher than the selected read potential, so that a very small cell current flows in the selected memory cell, or the cell current does not flow in the selected memory cell. Thus, the potential of sense node SEN is lowered very moderately, and a potential drop amount does not reach dV before time t7.

Consequently, after control signal VB is set to "H" at time t6, and control signal VB is set to "L" at time t7', the level of sense node SEN is still at "H" at time t7.

Thus, P channel MOS transistor 41 is turned off, and input node INVB of latch circuit 35B becomes "L", and output node LATB of latch circuit 35B becomes "H".

As described above, the QPW cell (second group) and the write-complete cell (third group) are discriminated.

In addition, the relationship between data INVA and INVB latched to the two latch circuits and the three groups is as shown in Table 1 similar to the first embodiment.

As described above, according to the second embodiment, the threshold voltage of the selected memory cell can be classified to one of the three groups through one verify read operation by use of the difference in magnitude of the sense current flowing in the selected memory cell.

Therefore, as is obvious from the waveform diagram in FIG. 18, since a setup period to change the potential of the selected word line, and a recovery period of the bit line after the lockout operation are not needed, a write operation can be performed at high speed due to the shortened verify read time.

(3) Others

A write operation after the verify read operation is similar to the conventional QPW as shown in FIG. 12.

When the threshold voltage of a selected memory cell is classified to a first group (write-incomplete cell), bit line BL is set to a first potential (ground potential Vss, for example), and then write potential Vpgm is applied to a selected word line. The usual write operation is performed for the selected memory cell.

Meanwhile, when the threshold voltage of the selected memory cell is classified to a second group (QPW cell), bit line BL is set to a second potential (Vb1, for example) higher than the first potential, and then write potential Vpgm is applied to the selected word line. A write operation weaker (threshold shift width is smaller) than usual write operation is performed for the selected memory cell.

Furthermore, when the threshold voltage of the selected memory cell is classified to a third group (write-complete cell), bit line BL is set to a third potential (Vinhibit, for example) higher than the second potential, and then write potential Vpgm is applied to the selected word line. The write operation is inhibited in the selected memory cell.

5. Modification Examples

According to the first and second embodiments, the selected memory cell is classified to one of the three groups by varying the potential of the one sense node according to the magnitude of the cell current and differentiating the detection time of the potential of the sense node under the condition that the selected read potential is kept at a constant value.

Meanwhile, according to modification examples, the threshold voltage of the selected memory cell is classified to one of the three groups by providing two sense nodes having different precharge potentials, and varying the potentials of the two sense nodes separately according to the magnitude of the cell current.

(1) First Modification Example

Figure 19:
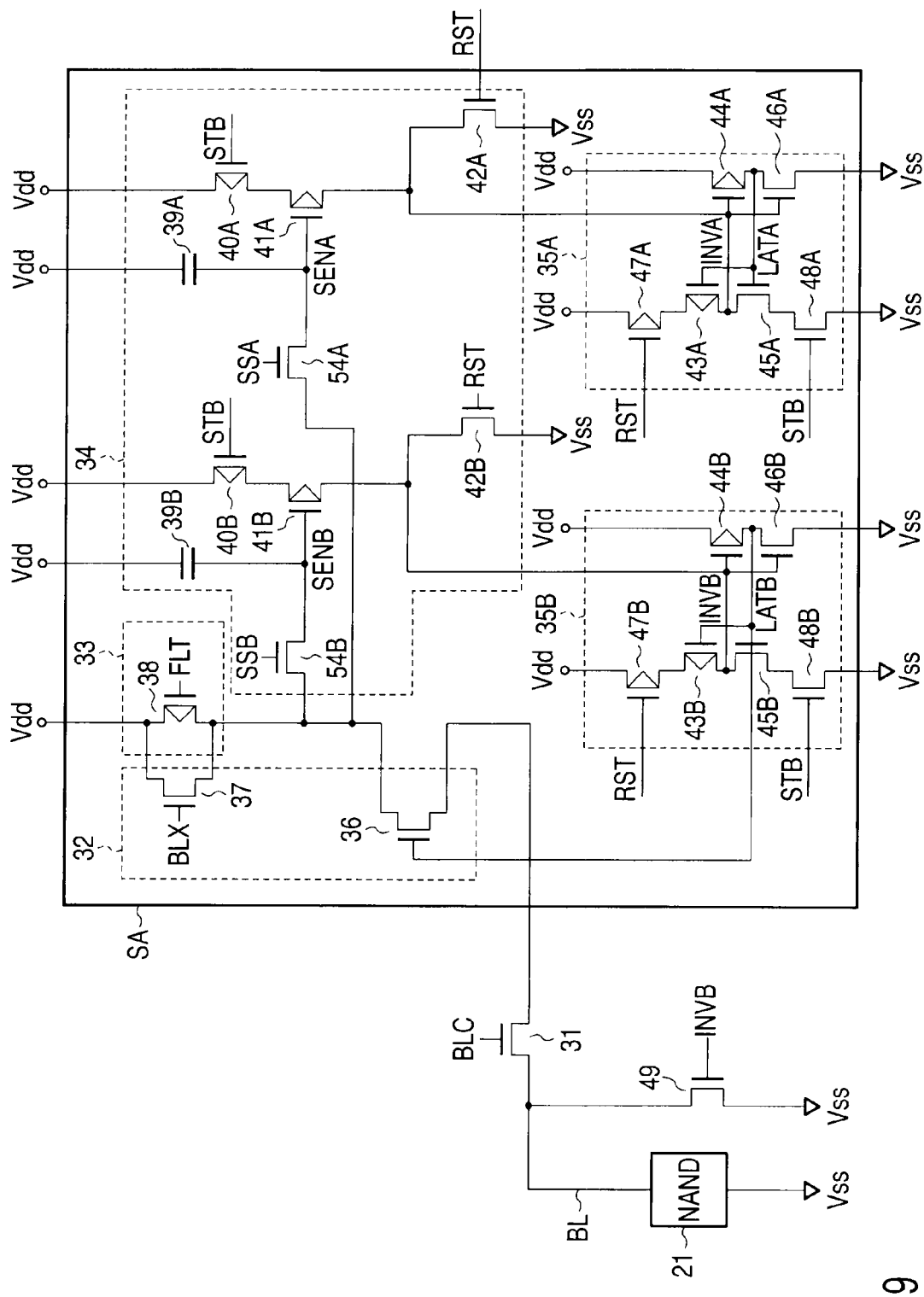
FIG. 19 is a diagram showing a sense amplifier of a first modification example.

FIG. 19 shows a sense amplifier according to a first modification example.

The first modification example is a modification example of the first embodiment.

The first modification example differs from the first embodiment only in the configuration of discrimination circuit 34. Since the rest are the same as those in the first embodiment, a description will be made of discrimination circuit 34 only here.

Discrimination circuit 34 includes P channel MOS transistors 40A, 40B, 41A, 41B, and N channel MOS transistors 42A, 42B, 54A, and 54B, and capacitors 39A and 39B.

More specifically, discrimination circuit 34 has two sense nodes SENA and SENB.

Sense node SENA is connected to bit line BL through the N channel MOS transistor 54A, and sense node SENB is connected to bit line BL through N channel MOS transistor 54B.

Since there are two sense nodes, N channel MOS transistors 54A and 54B are needed while N channel MOS transistors 52 and 53 in FIG. 15 are not needed.

In addition, capacities of capacitors 39A and 39B are differentiated to differentiate the precharge potentials of two sense nodes SENA and SENB.

FIG. 20 shows an operation waveform of the sense amplifier shown in FIG. 19.

First, XV (V1, for example) is applied to a selected word line as a selected read potential, and non-selected read potential Vread (5 to 7 V, for example) higher than the selected read potential to a non-selected word line.

In addition, sense node SENA is charged to precharge potential Vpre1, and sense node SENB is charged to precharge potential Vpre21. Here, it is to be noted that Vpre1>Vpre2.

Thus, when control signal FLT is set to "H" and selected signal SSA is set to "H" under the condition that bit line BL is fixed to a constant potential (0.5 V, for example), the potential of sense node SENA becomes as described below according to the threshold voltage of the selected memory cell.

That is, when the threshold voltage of a selected memory cell is lower than the selected read potential, a large cell current flows in the selected memory cell, and the speed at which the potential of sense node SENA is lowered is increased. Meanwhile, when the threshold voltage of the selected memory cell is higher than the selected read potential, a small cell current flows in the selected memory cell, or the cell current does not flow in the selected memory cell, so that the speed at which the potential of sense node SENA is lowered is decreased.

More specifically, when selected signal SSA becomes "H", N channel MOS transistor 54A shown in FIG. 19 is turned on. In addition, when control signal STB is set to "L" at first point t4 after a first period has passed since discharge start time t3 to start discharge from sense node SENA, the potential of sense node SENA is latched to latch circuit 35A shown in FIG. 19.

More specifically, when the selected memory cell is a write-incomplete cell (first group), a potential drop amount reaches dV1 which is lower than the threshold voltage of P channel MOS transistor 41A shown in FIG. 19 at first point t4, and sense node SENA becomes "L". As a result, P channel MOS transistor 41A is turned on, and INVA becomes "H" and LATA becomes "L".

Meanwhile, when the selected memory cell is a QPW cell (second group) or a write-complete cell (third group), a potential drop amount does not reach dV1 at first point t4, and sense node SENA is at "H". As a result, P channel MOS transistor 41A is turned off, and INVA becomes "L" and LATA becomes "H".

Thus, the write-incomplete cell (first group) is discriminated first.

Then, selected signal SSA is set to "L", and N channel MOS transistor 54A shown in FIG. 19 is turned off.

Next, when selected signal SSB is set to "H", the potential of sense node SENB becomes as described below according to the threshold voltage of the selected memory cell.

That is, when the threshold voltage of the selected memory cell is lower than the selected read potential, a large cell current flows in the selected memory cell, and the speed at which the potential of sense node SENB is lowered is increased. Meanwhile, when the threshold voltage of the selected memory cell is higher than the selected read potential, a small cell current flows in the selected memory cell, or the cell current does not flow in the selected memory cell, so that the speed at which the potential of sense node SENB is lowered is decreased.

More specifically, when selected signal SSB becomes "H", N channel MOS transistor 54B shown in FIG. 19 is turned on. In addition, when control signal STB is set to "L" at second point t7 after a second period has passed since discharge start time t6 to start discharge from sense node SENB, the potential of sense node SENB is latched to latch circuit 35B shown in FIG. 19.

Here, precharge potential Vpre2 of sense node SENB is lower than precharge potential Vpre1 of sense node SENA.

Therefore, for example, when the selected memory cell is the write-incomplete cell (first group) or the QPW cell (second group), a potential drop amount reaches dV2 which is lower than the threshold voltage of P channel MOS transistor 41B shown in FIG. 19 at second point t7, and sense node SENB becomes "L". As a result, P channel MOS transistor 41B is turned on, and INVA becomes "H" and LATA becomes "L".

In addition, when the selected memory cell is the write-complete cell (third group), a potential drop amount does not reach dV2 at second point t7, and sense node SENB is at "H". As a result, P channel MOS transistor 41B is turned off, and INVA becomes "L" and LATA becomes "H".

Thus, the QPW cell (second group) and write-complete cell (third group) are discriminated.

In addition, it is preferable that the first period and the second period are equal.

According to the first modification example, the threshold voltage of the selected memory cell is classified to one of the three groups by providing the two sense nodes having the different precharge potentials, and varying the potentials of the two sense nodes according to the magnitude of the cell current individually.

Therefore, according to the first modification example, similar to the first embodiment, a setup period to vary the potential of the selected word line and a recovery period of the bit line after the lockout operation are not needed, so that a write operation can be performed at high speed due to the shortened verify read time.

(2) Second Modification Example

Figure 21:
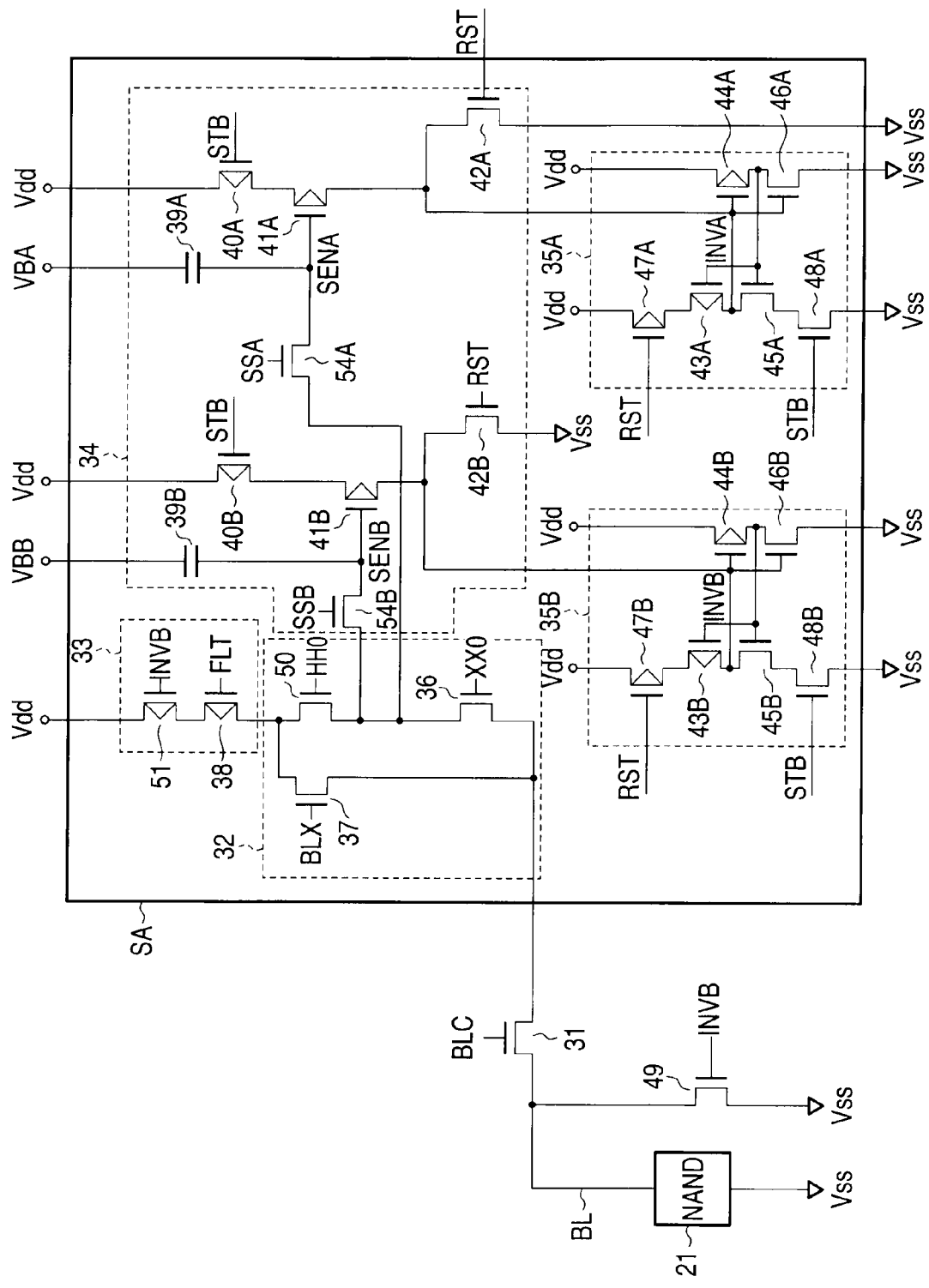
FIG. 21 is a diagram showing a sense amplifier of a second modification example.

FIG. 21 shows a sense amplifier according to a second modification example.

The second modification example is a modification example of the second embodiment.

The second modification example differs from the second embodiment only in the configuration of discrimination circuit 34. Since the rest are the same as those in the second embodiment, a description will be made of discrimination circuit 34 only here.

Discrimination circuit 34 includes P channel MOS transistors 40A, 40B, 41A, 41B, and N channel MOS transistors 42A, 42B, 54A, and 54B, and capacitors 39A and 39B.

More specifically, discrimination circuit 34 has two sense nodes SENA and SENB.

Sense node SENA is connected to bit line BL through N channel MOS transistor 54A, and sense node SENB is connected to bit line BL through N channel MOS transistor 54B.

Since there are two sense nodes, N channel MOS transistors 54A and 54B are needed while N channel MOS transistors 52 and 53 in FIG. 17 are not needed.

In addition, capacities of capacitors 39A and 39B are differentiated to differentiate the precharge potentials of two sense nodes SENA and SENB.

Furthermore, control signal VBA is applied to one end of capacitor 39A, and control signal VBB is applied to one end of capacitor 39B.

Figure 22:
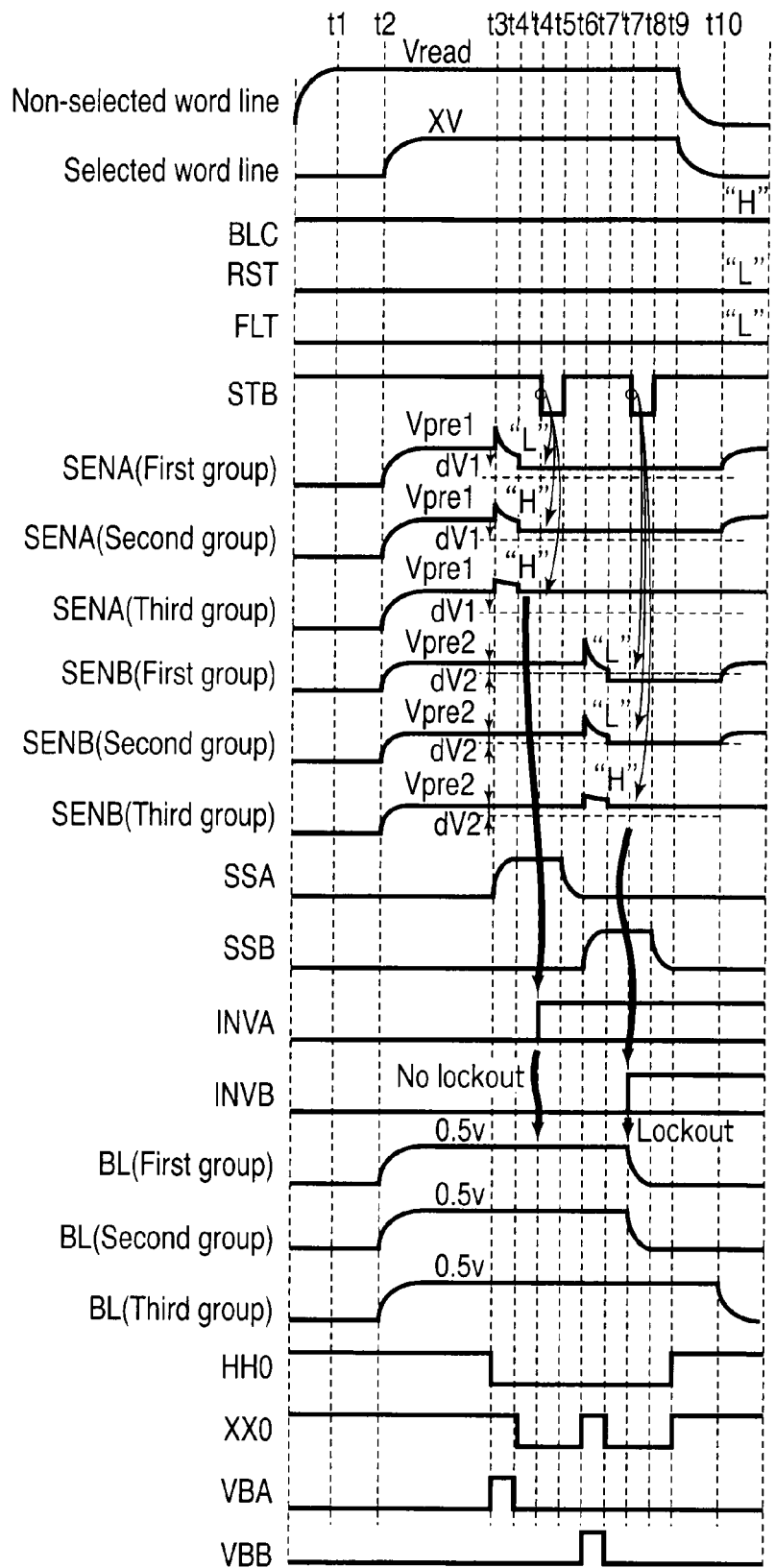
FIG. 22 is a diagram showing an operation waveform of the sense amplifier in FIG. 21.

FIG. 22 shows an operation waveform of the sense amplifier shown in FIG. 21.

First, XV (V1, for example) is applied to a selected word line as a selected read potential, and non-selected read potential Vread (5 to 7 V, for example) higher than the selected read potential is applied to a non-selected word line.

In addition, sense node SENA is charged to precharge potential Vpre1, and sense node SENB is charged to precharge potential Vpre2. Here, it is to be noted that Vpre1>Vpre2.

Thus, when control signal HHL is set to "L" and control signal VB is set to "H" under the condition that bit line BL is fixed to a constant potential (0.5 V, for example), the potentials of the two sense nodes SENA and SENB are raised due to capacity coupling.

Thus, when selected signal SSA is set to "H", the potential of sense node SENA becomes as described below according to the threshold voltage of the selected memory cell.

That is, when the threshold voltage of a selected memory cell is lower than the selected read potential, a large cell current flows in the selected memory cell, and the speed at which the potential of sense node SENA is lowered is increased. Meanwhile, when the threshold voltage of the selected memory cell is higher than the selected read potential, a small cell current flows in the selected memory cell, or the cell current does not flow in the selected memory cell, so that the speed at which the potential of sense node SENA is lowered is decreased.

More specifically, when selected signal SSA becomes "H", N channel MOS transistor 54A shown in FIG. 21 is turned on. In addition, when control signal STB is set to "L" at first point t4 after a first period has passed since discharge start time t3 to start discharge from sense node SENA, the potential of sense node SENA is latched to latch circuit 35A shown in FIG. 21.

More specifically, when the selected memory cell is a write-incomplete cell (first group), control signal VBA is set to "H" at time t3, and control signal VBA is set to "L" at time t4', and a potential drop amount reaches dV1 which is lower than the threshold voltage of P channel MOS transistor 41A shown in FIG. 21 at first point t4.

Therefore, sense node SENA becomes "L". As a result, P channel MOS transistor 41A is turned on, and INVA becomes "H" and LATA becomes "L".

In addition, when the selected memory cell is a QPW cell (second group) or a write-complete cell (third group), control signal VBA is set to "H" at time t3, control signal VBA is set to "L" at time t4', and then a potential drop amount does not reach dV1 at first point t4.

Therefore, sense node SENA becomes "H". As a result, P channel MOS transistor 41A is turned off, and INVA becomes "L" and LATA becomes "H".

Thus, the write-incomplete cell (first group) is discriminated first.

Thereafter, selected signal SSA is set to "L", and N channel MOS transistor 54A in FIG. 21 is turned off.

Then, when selected signal SSB is set to "H", the potential of sense node SENB becomes as described below according to the threshold voltage of the selected memory cell.

That is, when the threshold voltage of the selected memory cell is lower than the selected read potential, a large cell current flows in the selected memory cell, and the speed at which the potential of sense node SENB is lowered is increased. Meanwhile, when the threshold voltage of the selected memory cell is higher than the selected read potential, a small cell current flows in the selected memory cell, or the cell current does not flow in the selected memory cell, so that the speed at which the potential of sense node SENB is lowered is decreased.

More specifically, when selected signal SSB becomes "H", N channel MOS transistor 54B shown in FIG. 21 is turned on. In addition, when control signal STB is set to "L" at second point t7 after a second period has passed since discharge start time t6 to start discharge from sense node SENB, the potential of sense node SENB is latched to latch circuit 35B shown in FIG. 21.

Here, precharge potential Vpre2 of sense node SENB is lower than precharge potential Vpre1 of sense node SENA.

Therefore, for example, when the selected memory cell is the write-incomplete cell (first group) or the QPW cell (second group), control signal VBB is set to "H" at time t6, and control signal VBB is set to "L" at time t7', and a potential drop amount reaches dV2 which is lower than the threshold voltage of P channel MOS transistor 41B shown in FIG. 21 at second point t7.

Thus, sense node SENB becomes "L". As a result, P channel MOS transistor 41B is turned on, and INVA becomes "H" and LATA becomes "L".

In addition, when the selected memory cell is the write-complete cell (third group), control signal VBB is set to "H" at time t6, control signal VBB is set to "L" at time t7', and a potential drop amount does not reach dV2 at second point t7.

Thus, sense node SENB becomes "H". As a result, P channel MOS transistor 41B is turned off, and INVA becomes "L" and LATA becomes "H".

Thus, the QPW cell (second group) and write-complete cell (third group) are discriminated.

In addition, it is preferable that the first period and the second period are equal.

According to the second modification example, the threshold voltage of the selected memory cell is classified to one of the three groups by providing the two sense nodes having the different precharge potentials, and varying the potentials of the two sense nodes according to the magnitude of the cell current individually.

Therefore, according to the second modification example, similar to the second embodiment, a setup period to vary the potential of the selected word line and a recovery period of the bit line after the lockout operation are not needed and a write operation can be performed at high speed due to the shortened verify read time.

6. Application Examples

The example of the present invention is effectively applied to a multi-level NAND flash memory.

FIGS. 7 and 14 show a case of four values.

The lowest state of the threshold voltages of the memory cell is an erased state ("0"-state), and there are three written states ("1"-state, "2"-state, and "3"-state).

The highest state of the threshold voltage of the memory cell is "3"-state, and the threshold voltage of the memory cell in "2"-state is lower than the threshold voltage of the memory cell in "3"-state, and threshold voltage of the memory cell in "1"-state is lower than the threshold voltage of the memory cell in "2"-state.

The initial state of the memory cell is the erased state.

At the time of "1"-write, a selected read potential used in the verify read operation is V1, and at the time of "2"-write, a selected read potential used in the verify read operation is V2, and at the time of "3"-write, a selected read potential used in the verify read operation is V3.

Here, it is to be noted that V1<V2<V3.

The selected read potentials can be selected from the values within a range of 0 to 4 V, for example.

The example of the present invention can be applied to the nonvolatile semiconductor memories in general other than the multi-level NAND flash memory.

7. Conclusion

According to the invention, a write operation can be performed at high speed thanks to a new verify read technique.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A nonvolatile semiconductor memory comprising:
   first and second select gate transistors;
   memory cells connected in series between the first and second select gate transistors;
   a source line connected to the first select gate transistor;
   a bit line connected to the second select gate transistor;
   a selected word line which is connected to a selected memory cell as a target of a verify reading among the memory cells;
   a non-selected word line which is connected to a non-selected memory cell except the selected memory cell among the memory cells;
   a potential generating circuit for generating a selected read potential which is supplied to the selected word line, and generating a non-selected read potential larger than the selected read potential, which is supplied to the non-selected word line; and
   a control circuit which classifies a threshold voltage of the selected memory cell to one of three groups by verifying which area among three area which are isolated by two values does a cell current of the selected memory cell belong, when the selected read potential is a first value.

2. The memory according to claim 1, wherein the three groups comprises:
   a first group which the threshold voltage of the selected memory cell belongs in a first threshold range as a non-completion of writing;

a second group which the threshold voltage of the selected memory cell belongs in a second threshold range as a non-completion of writing higher than the first threshold range; and a third group which the threshold voltage of the selected memory cell belongs in a third threshold range as a completion of writing higher than the second threshold range.

3. The memory according to claim 1, wherein the control circuit set the bit line to a first potential when the threshold voltage of the selected memory cell classifies to the first group in a writing after the verify reading, the control circuit set the bit line to a second potential higher than the first potential when the threshold voltage of the selected memory cell classifies to the second group in the writing after the verify reading, and the control circuit set the bit line to a third potential higher than the second potential when the threshold voltage of the selected memory cell classifies to the third group in the writing after the verify reading.

4. The memory according to claim 1, further comprising:

a sense node connected to the bit line;

a first latch circuit latched a potential of the sense node at a first point after a first term from a start point which a discharge of the sense node is started by the cell current; and a second latch circuit latched a potential of the sense node at a second point after a second term longer than the first term from the start point.

5. The memory according to claim 4, wherein the control circuit verifies which area among the three areas does the cell current of the selected memory cell belong, based on the potentials latched the first and second latch circuits.

6. The memory according to claim 1, further comprising:

first and second sense nodes connected to the bit line, which precharge potentials of the first and second sense nodes are different from each other;

a first latch circuit latched a potential of the first sense node at a first point after a first term from a start point which a discharge of the first sense node is started by the cell current; and a second latch circuit latched a potential of the second sense node at a second point after a second term from a start point which a discharge of the second sense node is started by the cell current.

7. The memory according to claim 6, wherein the control circuit verifies which area among the three areas does the cell current of the selected memory cell belong, based on the potentials latched the first and second latch circuits.

8. The memory according to claim 1, wherein each of the memory cells stores three or more level data.

9. The memory according to claim 8, wherein the first value as the selected read potential is selected from two or more values which realizes a multi-level data.

10. The memory according to claim 1, wherein the memory is a NAND flash memory.

* * * * *